(12) United States Patent
Sivadasan et al.

(10) Patent No.: US 8,120,408 B1
(45) Date of Patent: Feb. 21, 2012

(54) VOLTAGE CONTROLLED OSCILLATOR DELAY CELL AND METHOD

(75) Inventors: Mohandas Palatholmana Sivadasan, Bangalore (IN); Gajendar Rohilla, Bangalore (IN)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 12/218,404

(22) Filed: Jul. 14, 2008

Related U.S. Application Data

(63) Continuation of application No. 11/415,588, filed on May 1, 2006, now Pat. No. 7,400,183.

(60) Provisional application No. 60/678,397, filed on May 5, 2005.

(51) Int. Cl.
  *H03H 11/26* (2006.01)
(52) U.S. Cl. ............ 327/261; 327/52; 327/287
(58) Field of Classification Search .......... 327/261, 327/263, 265, 285, 287, 288, 52, 55
See application file for complete search history.

(56) References Cited

U.S. PATENT DOCUMENTS

| | | | |
|---|---|---|---|
| 3,600,690 A | 8/1971 | White | |
| 3,725,804 A | 4/1973 | Langan | |
| 3,740,588 A | 6/1973 | Stratton et al. | |
| 3,805,245 A | 4/1974 | Brooks et al. | |
| 3,810,036 A | 5/1974 | Bloedom | |
| 3,831,113 A | 8/1974 | Ahmed | |
| 3,845,328 A | 10/1974 | Hollingsworth | |
| 3,940,760 A | 2/1976 | Brokaw | |
| 4,061,987 A | 12/1977 | Nagahama | |
| 4,134,073 A | 1/1979 | MacGregor | |
| 4,138,671 A | 2/1979 | Comer et al. | |
| 4,176,258 A | 11/1979 | Jackson | |
| 4,250,464 A | 2/1981 | Schade, Jr. | |
| 4,272,760 A | 6/1981 | Prazak et al. | |
| 4,283,713 A | 8/1981 | Philipp | |
| 4,326,135 A | 4/1982 | Jarrett et al. | |
| 4,344,067 A | 8/1982 | Lee | |
| 4,380,083 A | 4/1983 | Andersson et al. | |
| 4,438,404 A | 3/1984 | Philipp | |
| 4,475,151 A | 10/1984 | Philipp | |
| 4,497,575 A | 2/1985 | Philipp | |
| 4,604,363 A | 8/1986 | Newhouse et al. | |

(Continued)

FOREIGN PATENT DOCUMENTS

DE 19710829 A1 9/1998

(Continued)

OTHER PUBLICATIONS

U.S. Appl. No. 11/415,588, Sivadasan et al.

(Continued)

*Primary Examiner* — An T Luu

(57) ABSTRACT

A delay cell circuit (200) is disclosed. The delay cell circuit may include a differential stage (202) and a cross-coupled stage (204). The cross-coupled stage can include resistors (210-0 and 210-1) the function to reduce a gain. The differential stage (202) and cross-coupled stage (204) can include variable currents sources (208 and 212), respectively. As frequency of operation increases, variable current source (208) provides a larger current to the differential stage (202) and variable current source (212) provides a smaller current to cross-coupled stage (204). Delay cell circuit (200) may be used in a voltage controlled oscillator (VCO). By including gain attenuating devices such as resistors (210-0 and 210-1), a frequency tuning range of the VCO may be increased.

14 Claims, 3 Drawing Sheets

U.S. PATENT DOCUMENTS

| | | | |
|---|---|---|---|
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Lewis et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |

| | | | | | | |
|---|---|---|---|---|---|---|
| 5,426,384 A | 6/1995 | May | | 5,629,891 A | 5/1997 | LeMoncheck et al. |
| 5,428,319 A | 6/1995 | Marvin et al. | | 5,630,052 A | 5/1997 | Shah |
| 5,430,395 A | 7/1995 | Ichimaru | | 5,630,057 A | 5/1997 | Hait |
| 5,430,687 A | 7/1995 | Hung et al. | | 5,630,102 A | 5/1997 | Johnson et al. |
| 5,430,734 A | 7/1995 | Gilson | | 5,631,577 A | 5/1997 | Freidin et al. |
| 5,432,476 A | 7/1995 | Tran | | 5,633,766 A | 5/1997 | Hase et al. |
| 5,438,672 A | 8/1995 | Dey | | 5,642,295 A | 6/1997 | Smayling |
| 5,440,305 A | 8/1995 | Signore et al. | | 5,646,544 A | 7/1997 | Iadanza |
| 5,451,887 A | 9/1995 | El-Avat et al. | | 5,646,901 A | 7/1997 | Sharpe-Geisler et al. |
| 5,453,904 A | 9/1995 | Higashiyama et al. | | 5,648,642 A | 7/1997 | Miller et al. |
| 5,455,525 A | 10/1995 | Ho et al. | | 5,651,035 A | 7/1997 | Tozun |
| 5,455,731 A | 10/1995 | Parkinson | | 5,652,893 A | 7/1997 | Ben-Meir et al. |
| 5,455,927 A | 10/1995 | Huang | | 5,661,433 A | 8/1997 | LaRosa et al. |
| 5,457,410 A | 10/1995 | Ting | | 5,663,900 A | 9/1997 | Bhandari et al. |
| 5,457,479 A | 10/1995 | Cheng | | 5,663,965 A | 9/1997 | Seymour |
| 5,463,591 A | 10/1995 | Aimoto et al. | | 5,664,199 A | 9/1997 | Kuwahara |
| 5,479,603 A | 12/1995 | Stone et al. | | 5,666,480 A | 9/1997 | Leung et al. |
| 5,479,643 A | 12/1995 | Bhaskar et al. | | 5,670,915 A | 9/1997 | Cooper et al. |
| 5,479,652 A | 12/1995 | Dreyer et al. | | 5,673,198 A | 9/1997 | Lawman et al. |
| 5,481,471 A | 1/1996 | Naglestad | | 5,675,825 A | 10/1997 | Dreyer et al. |
| 5,488,204 A | 1/1996 | Mead et al. | | 5,677,691 A | 10/1997 | Hosticka et al. |
| 5,491,458 A | 2/1996 | McCune | | 5,680,070 A | 10/1997 | Anderson et al. |
| 5,493,246 A | 2/1996 | Anderson | | 5,682,032 A | 10/1997 | Philipp |
| 5,493,723 A | 2/1996 | Beck et al. | | 5,684,434 A | 11/1997 | Mann et al. |
| 5,495,077 A | 2/1996 | Miller et al. | | 5,684,952 A | 11/1997 | Stein |
| 5,495,593 A | 2/1996 | Elmer et al. | | 5,686,844 A | 11/1997 | Hull et al. |
| 5,495,594 A | 2/1996 | MacKenna et al. | | 5,687,325 A | 11/1997 | Chang |
| 5,497,119 A | 3/1996 | Tedrow et al. | | 5,689,195 A | 11/1997 | Cliff et al. |
| 5,499,192 A | 3/1996 | Knapp et al. | | 5,689,196 A | 11/1997 | Schutte |
| 5,500,823 A | 3/1996 | Martin et al. | | 5,691,664 A | 11/1997 | Anderson et al. |
| 5,517,198 A | 5/1996 | McEwan | | 5,691,898 A | 11/1997 | Rosenberg et al. |
| 5,519,854 A | 5/1996 | Watt | | 5,694,063 A | 12/1997 | Burlison et al. |
| 5,521,529 A | 5/1996 | Agrawal et al. | | 5,696,952 A | 12/1997 | Pontarelli |
| 5,530,444 A * | 6/1996 | Tice et al. ............ 341/156 | | 5,699,024 A | 12/1997 | Manlove et al. |
| 5,530,673 A | 6/1996 | Tobita et al. | | 5,703,871 A | 12/1997 | Pope et al. |
| 5,530,813 A | 6/1996 | Paulsen et al. | | 5,706,453 A | 1/1998 | Cheng et al. |
| 5,537,057 A | 7/1996 | Leong et al. | | 5,708,589 A | 1/1998 | Beauvais |
| 5,541,878 A | 7/1996 | LeMoncheck et al. | | 5,708,798 A | 1/1998 | Lynch et al. |
| 5,542,055 A | 7/1996 | Amini et al. | | 5,710,906 A | 1/1998 | Ghosh et al. |
| 5,543,588 A | 8/1996 | Bisset et al. | | 5,712,969 A | 1/1998 | Zimmermann et al. |
| 5,543,590 A | 8/1996 | Gillespie et al. | | 5,721,931 A | 2/1998 | Gephardt et al. |
| 5,543,591 A | 8/1996 | Gillespie et al. | | 5,724,009 A | 3/1998 | Collins et al. |
| 5,544,067 A | 8/1996 | Rostoker et al. | | 5,727,170 A | 3/1998 | Mitchell et al. |
| 5,544,311 A | 8/1996 | Harenberg et al. | | 5,728,933 A | 3/1998 | Schultz et al. |
| 5,546,433 A | 8/1996 | Tran et al. | | 5,729,704 A | 3/1998 | Stone et al. |
| 5,546,562 A | 8/1996 | Patel | | 5,730,165 A | 3/1998 | Philipp |
| 5,552,725 A | 9/1996 | Ray et al. | | 5,732,277 A | 3/1998 | Kodosky et al. |
| 5,552,748 A | 9/1996 | O'Shaughnessy | | 5,734,272 A | 3/1998 | Belot et al. |
| 5,554,951 A | 9/1996 | Gough | | 5,734,334 A | 3/1998 | Hsieh et al. |
| 5,555,452 A | 9/1996 | Callaway et al. | | 5,737,557 A | 4/1998 | Sullivan |
| 5,555,907 A | 9/1996 | Philipp | | 5,737,760 A | 4/1998 | Grimmer et al. |
| 5,557,762 A | 9/1996 | Okuaki et al. | | 5,745,011 A | 4/1998 | Scott |
| 5,559,502 A | 9/1996 | Schutte | | 5,748,048 A | 5/1998 | Moyal |
| 5,559,996 A | 9/1996 | Fujioka et al. | | 5,748,875 A | 5/1998 | Tzori |
| 5,563,526 A | 10/1996 | Hastings et al. | | 5,752,013 A | 5/1998 | Christensen et al. |
| 5,563,529 A | 10/1996 | Seltzer et al. | | 5,754,552 A | 5/1998 | Allmond et al. |
| 5,564,010 A | 10/1996 | Henry et al. | | 5,754,826 A | 5/1998 | Gamal et al. |
| 5,564,108 A | 10/1996 | Hunsaker et al. | | 5,757,368 A | 5/1998 | Gerpheide et al. |
| 5,565,658 A | 10/1996 | Gerpheide et al. | | 5,758,058 A | 5/1998 | Milburn |
| 5,566,702 A | 10/1996 | Philipp | | 5,761,128 A | 6/1998 | Watanabe |
| 5,572,665 A | 11/1996 | Nakabayashi et al. | | 5,763,909 A | 6/1998 | Mead et al. |
| 5,572,719 A | 11/1996 | Biesterfeldt | | 5,764,714 A | 6/1998 | Stansell et al. |
| 5,574,678 A | 11/1996 | Gorecki | | 5,767,457 A | 6/1998 | Gerpheide et al. |
| 5,574,852 A | 11/1996 | Bakker et al. | | 5,774,704 A | 6/1998 | Williams |
| 5,574,892 A | 11/1996 | Christensen | | 5,777,399 A | 7/1998 | Shibuya |
| 5,579,353 A | 11/1996 | Parmenter et al. | | 5,781,030 A | 7/1998 | Agrawal et al. |
| 5,587,945 A | 12/1996 | Lin et al. | | 5,781,747 A | 7/1998 | Kametani |
| 5,587,957 A | 12/1996 | Kowalczyk et al. | | 5,784,545 A | 7/1998 | Anderson et al. |
| 5,590,354 A | 12/1996 | Klapproth et al. | | 5,790,957 A | 8/1998 | Heidari |
| 5,594,388 A | 1/1997 | O'Shaughnessy et al. | | 5,796,183 A | 8/1998 | Hourmand |
| 5,594,734 A | 1/1997 | Worsley et al. | | 5,799,176 A | 8/1998 | Kapusta et al. |
| 5,594,876 A | 1/1997 | Getzlaff et al. | | 5,801,958 A | 9/1998 | Dangelo et al. |
| 5,594,890 A | 1/1997 | Yamaura et al. | | 5,802,073 A | 9/1998 | Platt |
| 5,600,262 A | 2/1997 | Kolze | | 5,802,290 A | 9/1998 | Casselman |
| 5,604,466 A | 2/1997 | Dreps et al. | | 5,805,792 A | 9/1998 | Swoboda et al. |
| 5,608,892 A | 3/1997 | Wakerly | | 5,805,897 A | 9/1998 | Glowny |
| 5,625,316 A | 4/1997 | Chambers et al. | | 5,808,883 A | 9/1998 | Hawkes |
| 5,625,583 A | 4/1997 | Hyatt | | 5,811,987 A | 9/1998 | Ashmore, Jr. et al. |
| 5,629,857 A | 5/1997 | Brennan | | 5,812,698 A | 9/1998 | Platt et al. |

| | | | | | |
|---|---|---|---|---|---|
| 5,818,254 A | 10/1998 | Agrawal et al. | 5,963,075 A | 10/1999 | Hiiragizawa |
| 5,818,444 A | 10/1998 | Alimpich et al. | 5,963,105 A | 10/1999 | Nguyen |
| 5,818,736 A | 10/1998 | Leibold | 5,963,503 A | 10/1999 | Lee |
| 5,819,028 A | 10/1998 | Manghirmalani et al. | 5,964,893 A | 10/1999 | Circello et al. |
| 5,822,387 A | 10/1998 | Mar | 5,966,027 A | 10/1999 | Kapusta et al. |
| 5,822,531 A | 10/1998 | Gorczyca et al. | 5,966,532 A | 10/1999 | McDonald et al. |
| 5,828,693 A | 10/1998 | Mays et al. | 5,968,135 A | 10/1999 | Teramoto et al. |
| 5,838,583 A | 11/1998 | Varadarajan et al. | 5,969,513 A | 10/1999 | Clark |
| 5,841,078 A | 11/1998 | Miller et al. | 5,969,632 A | 10/1999 | Diamant et al. |
| 5,841,996 A | 11/1998 | Nolan et al. | 5,973,368 A | 10/1999 | Pearce et al. |
| 5,844,256 A | 12/1998 | Mead et al. | 5,974,235 A | 10/1999 | Nunally et al. |
| 5,844,404 A | 12/1998 | Caser et al. | 5,977,791 A | 11/1999 | Veenstra |
| 5,848,285 A | 12/1998 | Kapusta et al. | 5,978,584 A | 11/1999 | Nishibata et al. |
| 5,850,156 A | 12/1998 | Wittman | 5,978,937 A | 11/1999 | Miyamori et al. |
| 5,852,733 A | 12/1998 | Chien et al. | 5,982,105 A | 11/1999 | Masters |
| 5,854,625 A | 12/1998 | Frisch et al. | 5,982,229 A | 11/1999 | Wong et al. |
| 5,857,109 A | 1/1999 | Taylor | 5,982,241 A | 11/1999 | Nguyen et al. |
| 5,861,583 A | 1/1999 | Schediwy et al. | 5,986,479 A | 11/1999 | Mohan |
| 5,861,875 A | 1/1999 | Gerpheide | 5,987,246 A | 11/1999 | Thomsen et al. |
| 5,864,242 A | 1/1999 | Allen et al. | 5,988,902 A | 11/1999 | Holehan |
| 5,864,392 A | 1/1999 | Winklhofer et al. | 5,994,939 A | 11/1999 | Johnson et al. |
| 5,867,046 A | 2/1999 | Sugasawa | 5,996,032 A | 11/1999 | Baker |
| 5,867,399 A | 2/1999 | Rostoker et al. | 5,999,725 A | 12/1999 | Barbier et al. |
| 5,869,979 A | 2/1999 | Bocchino | 6,002,268 A | 12/1999 | Sasaki et al. |
| 5,870,004 A | 2/1999 | Lu | 6,002,398 A | 12/1999 | Wilson |
| 5,870,309 A | 2/1999 | Lawman | 6,003,054 A | 12/1999 | Oshima et al. |
| 5,870,345 A | 2/1999 | Stecker | 6,003,107 A | 12/1999 | Ranson et al. |
| 5,872,464 A | 2/1999 | Gradinariu | 6,003,133 A | 12/1999 | Moughanni et al. |
| 5,874,958 A | 2/1999 | Ludolph | 6,005,814 A | 12/1999 | Mulholland et al. |
| 5,875,293 A | 2/1999 | Bell et al. | 6,005,904 A | 12/1999 | Knapp et al. |
| 5,877,656 A | 3/1999 | Mann et al. | 6,008,685 A | 12/1999 | Kunst |
| 5,878,425 A | 3/1999 | Redpath | 6,008,703 A | 12/1999 | Perrott et al. |
| 5,880,411 A | 3/1999 | Gillespie et al. | 6,009,270 A | 12/1999 | Mann |
| 5,880,598 A | 3/1999 | Duong | 6,009,496 A | 12/1999 | Tsai |
| 5,883,623 A | 3/1999 | Cseri | 6,011,407 A | 1/2000 | New |
| 5,886,582 A | 3/1999 | Stansell | 6,012,835 A | 1/2000 | Thompson et al. |
| 5,887,189 A | 3/1999 | Birns et al. | 6,014,135 A | 1/2000 | Fernandes |
| 5,889,236 A | 3/1999 | Gillespie et al. | 6,014,509 A | 1/2000 | Furtek et al. |
| 5,889,723 A | 3/1999 | Pascucci | 6,014,723 A | 1/2000 | Tremblay et al. |
| 5,889,988 A | 3/1999 | Held | 6,016,554 A | 1/2000 | Skrovan et al. |
| 5,894,226 A | 4/1999 | Koyama | 6,016,563 A | 1/2000 | Fleisher |
| 5,894,243 A | 4/1999 | Hwang | 6,018,559 A | 1/2000 | Azegami et al. |
| 5,894,565 A | 4/1999 | Furtek et al. | 6,023,422 A | 2/2000 | Allen et al. |
| 5,895,494 A | 4/1999 | Scalzi et al. | 6,023,565 A | 2/2000 | Lawman et al. |
| 5,896,068 A | 4/1999 | Moyal | 6,026,134 A | 2/2000 | Duffy et al. |
| 5,896,330 A | 4/1999 | Gibson | 6,026,501 A | 2/2000 | Hohl et al. |
| 5,898,345 A | 4/1999 | Namura et al. | 6,028,271 A | 2/2000 | Gillespie et al. |
| 5,900,780 A | 5/1999 | Hirose et al. | 6,028,959 A | 2/2000 | Wang et al. |
| 5,901,062 A | 5/1999 | Burch et al. | 6,031,365 A | 2/2000 | Sharpe-Geisler |
| 5,903,718 A | 5/1999 | Marik | 6,032,268 A | 2/2000 | Swoboda et al. |
| 5,905,398 A | 5/1999 | Todsen et al. | 6,034,538 A | 3/2000 | Abramovici |
| 5,909,544 A | 6/1999 | Anderson, II et al. | 6,035,320 A | 3/2000 | Kiriaki et al. |
| 5,911,059 A | 6/1999 | Profit, Jr. | 6,037,807 A | 3/2000 | Wu et al. |
| 5,914,465 A | 6/1999 | Allen et al. | 6,038,551 A | 3/2000 | Barlow et al. |
| 5,914,633 A | 6/1999 | Comino et al. | 6,041,406 A | 3/2000 | Mann |
| 5,914,708 A | 6/1999 | LaGrange et al. | 6,043,695 A | 3/2000 | O'Sullivan |
| 5,917,356 A | 6/1999 | Casal et al. | 6,043,719 A | 3/2000 | Lin et al. |
| 5,920,310 A | 7/1999 | Faggin et al. | 6,049,223 A | 4/2000 | Lytle et al. |
| 5,923,264 A | 7/1999 | Lavelle et al. | 6,049,225 A | 4/2000 | Huang et al. |
| 5,926,566 A | 7/1999 | Wang et al. | 6,051,772 A | 4/2000 | Cameron et al. |
| 5,929,710 A | 7/1999 | Bien | 6,052,035 A | 4/2000 | Nolan et al. |
| 5,930,148 A | 7/1999 | Bjorksten et al. | 6,052,524 A | 4/2000 | Pauna |
| 5,930,150 A | 7/1999 | Cohen et al. | 6,055,584 A | 4/2000 | Bridges et al. |
| 5,931,959 A | 8/1999 | Kwiat | 6,057,705 A | 5/2000 | Wojewoda et al. |
| 5,933,023 A | 8/1999 | Young | 6,058,263 A | 5/2000 | Voth |
| 5,933,356 A | 8/1999 | Rostoker et al. | 6,058,452 A | 5/2000 | Rangasayee et al. |
| 5,933,816 A | 8/1999 | Zeanah et al. | 6,061,511 A | 5/2000 | Marantz et al. |
| 5,935,233 A | 8/1999 | Jeddeloh | 6,066,961 A | 5/2000 | Lee et al. |
| 5,935,266 A | 8/1999 | Thurnhofer et al. | 6,070,003 A | 5/2000 | Gove et al. |
| 5,939,904 A | 8/1999 | Fetterman et al. | 6,072,803 A | 6/2000 | Allmond et al. |
| 5,939,949 A | 8/1999 | Olgaard et al. | 6,075,941 A | 6/2000 | Itoh et al. |
| 5,941,991 A | 8/1999 | Kageshima | 6,079,985 A | 6/2000 | Wohl et al. |
| 5,942,733 A | 8/1999 | Allen et al. | 6,081,140 A | 6/2000 | King |
| 5,943,052 A | 8/1999 | Allen et al. | 6,094,730 A | 7/2000 | Lopez et al. |
| 5,945,878 A | 8/1999 | Westwick et al. | 6,097,211 A | 8/2000 | Couts-Martin et al. |
| 5,949,632 A | 9/1999 | Barreras, Sr. et al. | 6,097,432 A | 8/2000 | Mead et al. |
| 5,952,888 A | 9/1999 | Scott | 6,101,457 A | 8/2000 | Barch et al. |
| 5,956,279 A | 9/1999 | Mo et al. | 6,101,617 A | 8/2000 | Burckhartt et al. |
| 5,959,871 A | 9/1999 | Pierzchala et al. | 6,104,217 A | 8/2000 | Magana |

| | | | | | | |
|---|---|---|---|---|---|---|
| 6,104,325 | A | 8/2000 | Liaw et al. | 6,239,389 B1 | 5/2001 | Allen et al. |
| 6,107,769 | A | 8/2000 | Saylor et al. | 6,239,798 B1 | 5/2001 | Ludolph et al. |
| 6,107,826 | A | 8/2000 | Young et al. | 6,240,375 B1 | 5/2001 | Sonoda |
| 6,107,882 | A | 8/2000 | Gabara et al. | 6,246,258 B1 | 6/2001 | Lesea |
| 6,110,223 | A | 8/2000 | Southgate et al. | 6,246,410 B1 | 6/2001 | Bergeron et al. |
| 6,111,431 | A | 8/2000 | Estrada | 6,249,167 B1 | 6/2001 | Oguchi et al. |
| 6,112,264 | A | 8/2000 | Beasley et al. | 6,249,447 B1 | 6/2001 | Boylan et al. |
| 6,121,791 | A | 9/2000 | Abbott | 6,253,250 B1 | 6/2001 | Evans et al. |
| 6,121,805 | A | 9/2000 | Thamsirianunt et al. | 6,253,754 B1 | 7/2001 | Roohparvar |
| 6,121,965 | A | 9/2000 | Kenney et al. | 6,262,717 B1 | 7/2001 | Donohue et al. |
| 6,125,416 | A | 9/2000 | Warren | 6,263,302 B1 | 7/2001 | Hellestrand et al. |
| 6,130,548 | A | 10/2000 | Koifman | 6,263,339 B1 | 7/2001 | Hirsch |
| 6,130,551 | A | 10/2000 | Agrawal et al. | 6,263,484 B1 | 7/2001 | Yang |
| 6,130,552 | A | 10/2000 | Jefferson et al. | 7,171,455 B1 | 7/2001 | Gupta et al. |
| 6,133,773 | A | 10/2000 | Garlepp et al. | 6,271,679 B1 | 8/2001 | McClintock et al. |
| 6,134,181 | A | 10/2000 | Landry | 6,275,117 B1 | 8/2001 | Abugharbieh et al. |
| 6,134,516 | A | 10/2000 | Wang et al. | 6,278,568 B1 | 8/2001 | Cloke et al. |
| 6,137,308 | A | 10/2000 | Nayak | 6,280,391 B1 | 8/2001 | Olson et al. |
| 6,141,376 | A | 10/2000 | Shaw | 6,281,753 B1 | 8/2001 | Corsi et al. |
| 6,141,764 | A | 10/2000 | Ezell | 6,282,547 B1 | 8/2001 | Hirsch |
| 6,144,327 | A | 11/2000 | Distinti et al. | 6,282,551 B1 | 8/2001 | Anderson et al. |
| 6,148,104 | A | 11/2000 | Wang et al. | 6,286,127 B1 | 9/2001 | King et al. |
| 6,148,441 | A | 11/2000 | Woodward | 6,288,707 B1 | 9/2001 | Philipp |
| 6,149,299 | A | 11/2000 | Aslan et al. | 6,289,300 B1 | 9/2001 | Brannick et al. |
| 6,150,866 | A | 11/2000 | Eto et al. | 6,289,478 B1 | 9/2001 | Kitagaki |
| 6,154,064 | A | 11/2000 | Proebsting | 6,289,489 B1 | 9/2001 | Bold et al. |
| 6,157,024 | A | 12/2000 | Chapdelaine et al. | 6,292,028 B1 | 9/2001 | Tomita |
| 6,157,270 | A | 12/2000 | Tso | 6,294,932 B1 | 9/2001 | Watarai |
| 6,161,199 | A | 12/2000 | Szeto et al. | 6,294,962 B1 | 9/2001 | Mar |
| 6,166,367 | A | 12/2000 | Cho | 6,298,320 B1 | 10/2001 | Buckmaster et al. |
| 6,166,960 | A | 12/2000 | Marneweck et al. | 6,304,014 B1 | 10/2001 | England et al. |
| 6,167,077 | A | 12/2000 | Ducaroir | 6,304,101 B1 | 10/2001 | Nishihara |
| 6,167,364 | A | 12/2000 | Stellenberg et al. | 6,304,790 B1 | 10/2001 | Nakamura et al. |
| 6,167,559 | A | 12/2000 | Furtek et al. | 6,307,413 B1 | 10/2001 | Dalmia et al. |
| 6,169,383 | B1 | 1/2001 | Sabin et al. | 6,310,521 B1 | 10/2001 | Dalmia |
| 6,172,428 | B1 | 1/2001 | Jordan | 6,310,611 B1 | 10/2001 | Caldwell |
| 6,172,571 | B1 | 1/2001 | Moyal et al. | 6,311,149 B1 | 10/2001 | Ryan et al. |
| 6,173,419 | B1 | 1/2001 | Barnett | 6,314,530 B1 | 11/2001 | Mann |
| 6,175,914 | B1 | 1/2001 | Mann | 6,320,184 B1 | 11/2001 | Winklhofer et al. |
| 6,175,949 | B1 | 1/2001 | Gristede et al. | 6,320,282 B1 | 11/2001 | Caldwell |
| 6,181,163 | B1 | 1/2001 | Agrawal et al. | 6,321,369 B1 | 11/2001 | Heile et al. |
| 6,183,131 | B1 | 2/2001 | Holloway et al. | 6,323,846 B1 | 11/2001 | Westerman et al. |
| 6,185,127 | B1 | 2/2001 | Myers et al. | 6,324,628 B1 | 11/2001 | Chan |
| 6,185,450 | B1 | 2/2001 | Seguine et al. | 6,326,859 B1 | 12/2001 | Goldman et al. |
| 6,185,522 | B1 | 2/2001 | Bakker | 6,332,137 B1 | 12/2001 | Hori et al. |
| 6,185,703 | B1 | 2/2001 | Guddat et al. | 6,332,201 B1 | 12/2001 | Chin et al. |
| 6,185,732 | B1 | 2/2001 | Mann et al. | 6,337,579 B1 | 1/2002 | Mochida |
| 6,188,228 | B1 | 2/2001 | Philipp | 6,339,815 B1 | 1/2002 | Feng et al. |
| 6,188,241 | B1 | 2/2001 | Gauthier et al. | 6,342,907 B1 | 1/2002 | Petty et al. |
| 6,188,381 | B1 | 2/2001 | van der Wal et al. | 6,345,383 B1 | 2/2002 | Ueki |
| 6,188,391 | B1 | 2/2001 | Seely et al. | 6,347,395 B1 | 2/2002 | Payne et al. |
| 6,188,975 | B1 | 2/2001 | Gay | 6,351,789 B1 | 2/2002 | Green |
| 6,191,603 | B1 | 2/2001 | Muradali et al. | 6,353,452 B1 | 3/2002 | Hamada et al. |
| 6,191,660 | B1 | 2/2001 | Mar et al. | 6,355,980 B1 | 3/2002 | Callahan |
| 6,191,998 | B1 | 2/2001 | Reddy et al. | 6,356,862 B2 | 3/2002 | Bailey |
| 6,192,431 | B1 | 2/2001 | Dabral et al. | 6,356,958 B1 | 3/2002 | Lin |
| 6,198,303 | B1 | 3/2001 | Rangasayee | 6,356,960 B1 | 3/2002 | Jones et al. |
| 6,201,407 | B1 | 3/2001 | Kapusta et al. | 6,359,950 B2 | 3/2002 | Gossmann et al. |
| 6,201,829 | B1 | 3/2001 | Schneider | 6,362,697 B1 | 3/2002 | Pulvirenti |
| 6,202,044 | B1 | 3/2001 | Tzori | 6,366,174 B1 | 4/2002 | Berry et al. |
| 6,204,687 | B1 | 3/2001 | Schultz et al. | 6,366,300 B1 | 4/2002 | Ohara et al. |
| 6,205,574 | B1 | 3/2001 | Dellinger et al. | 6,366,874 B1 | 4/2002 | Lee et al. |
| 6,208,572 | B1 | 3/2001 | Adams et al. | 6,366,878 B1 | 4/2002 | Grunert |
| 6,211,708 | B1 | 4/2001 | Kemmer | 6,371,878 B1 | 4/2002 | Bowen |
| 6,211,715 | B1 | 4/2001 | Terauchi | 6,373,954 B1 | 4/2002 | Malcolm et al. |
| 6,211,741 | B1 | 4/2001 | Dalmia | 6,374,370 B1 | 4/2002 | Bockhaus et al. |
| 6,215,352 | B1 | 4/2001 | Sudo | 6,377,009 B1 | 4/2002 | Philipp |
| 6,216,254 | B1 | 4/2001 | Pesce et al. | 6,377,575 B1 | 4/2002 | Mullaney et al. |
| 6,219,729 | B1 | 4/2001 | Keats et al. | 6,377,646 B1 | 4/2002 | Sha |
| 6,222,528 | B1 | 4/2001 | Gerpheide et al. | 6,380,811 B1 | 4/2002 | Zarubinsky et al. |
| 6,223,144 | B1 | 4/2001 | Barnett et al. | 6,380,929 B1 | 4/2002 | Platt |
| 6,223,147 | B1 | 4/2001 | Bowers | 6,380,931 B1 | 4/2002 | Gillespie et al. |
| 6,223,272 | B1 | 4/2001 | Coehlo et al. | 6,384,947 B1 | 5/2002 | Ackerman et al. |
| RE37,195 | E | 5/2001 | Kean | 6,385,742 B1 | 5/2002 | Kirsch et al. |
| 6,225,866 | B1 | 5/2001 | Kubota et al. | 6,388,109 B1 | 5/2002 | Schwarz et al. |
| 6,236,242 | B1 | 5/2001 | Hedberg | 6,388,464 B1 | 5/2002 | Lacey et al. |
| 6,236,275 | B1 | 5/2001 | Dent | 6,396,302 B2 | 5/2002 | New et al. |
| 6,236,278 | B1 | 5/2001 | Olgaard | 6,396,657 B1 | 5/2002 | Sun et al. |
| 6,236,593 | B1 | 5/2001 | Hong et al. | 6,397,232 B1 | 5/2002 | Cheng-Hung et al. |

| Patent | Kind | Date | Inventor |
|---|---|---|---|
| 6,401,230 | B1 | 6/2002 | Ahanessians et al. |
| 6,404,204 | B1 | 6/2002 | Farruggia et al. |
| 6,404,445 | B1 | 6/2002 | Galea et al. |
| 6,407,953 | B1 | 6/2002 | Cleeves |
| 6,408,432 | B1 | 6/2002 | Herrmann et al. |
| 6,411,665 | B1 | 6/2002 | Chan et al. |
| 6,411,974 | B1 | 6/2002 | Graham et al. |
| 6,414,671 | B1 | 7/2002 | Gillespie et al. |
| 6,421,698 | B1 | 7/2002 | Hong |
| 6,421,817 | B1 | 7/2002 | Mohan et al. |
| 6,425,109 | B1 | 7/2002 | Choukalos et al. |
| 6,429,882 | B1 | 8/2002 | Abdelnur et al. |
| 6,430,305 | B1 | 8/2002 | Decker |
| 6,433,645 | B1 | 8/2002 | Mann et al. |
| 6,437,805 | B1 | 8/2002 | Sojoodi et al. |
| 6,438,565 | B1 | 8/2002 | Ammirato et al. |
| 6,438,735 | B1 | 8/2002 | McElvain et al. |
| 6,438,738 | B1 | 8/2002 | Elayda |
| 6,441,073 | B1 | 8/2002 | Tanaka et al. |
| 6,449,628 | B1 | 9/2002 | Wasson |
| 6,449,755 | B1 | 9/2002 | Beausang et al. |
| 6,449,761 | B1 | 9/2002 | Greidinger et al. |
| 6,452,437 | B1 | 9/2002 | Takeuchi et al. |
| 6,452,514 | B1 | 9/2002 | Philipp |
| 6,453,175 | B2 | 9/2002 | Mizell et al. |
| 6,453,461 | B1 | 9/2002 | Chaiken |
| 6,456,304 | B1 | 9/2002 | Angiulo et al. |
| 6,457,355 | B1 | 10/2002 | Philipp |
| 6,457,479 | B1 | 10/2002 | Zhuang et al. |
| 6,460,172 | B1 | 10/2002 | Insenser Farre et al. |
| 6,463,488 | B1 | 10/2002 | San Juan |
| 6,466,036 | B1 | 10/2002 | Philipp |
| 6,466,078 | B1 | 10/2002 | Stiff |
| 6,466,898 | B1 | 10/2002 | Chan |
| 6,473,069 | B1 | 10/2002 | Gerpheide |
| 6,473,825 | B1 | 10/2002 | Worley et al. |
| 6,477,691 | B1 | 11/2002 | Bergamashi/Rab et al. |
| 6,480,921 | B1 | 11/2002 | Mansoorian et al. |
| 6,483,343 | B1 | 11/2002 | Faith et al. |
| 6,487,700 | B1 | 11/2002 | Fukushima |
| 6,489,899 | B1 | 12/2002 | Ely et al. |
| 6,490,213 | B1 | 12/2002 | Mu et al. |
| 6,492,834 | B1 | 12/2002 | Lytle et al. |
| 6,496,969 | B2 | 12/2002 | Feng et al. |
| 6,496,971 | B1 | 12/2002 | Lesea et al. |
| 6,498,720 | B2 | 12/2002 | Glad |
| 6,499,134 | B1 | 12/2002 | Buffet et al. |
| 6,499,359 | B1 | 12/2002 | Washeleski et al. |
| 6,504,403 | B2 | 1/2003 | Bangs et al. |
| 6,507,214 | B1 | 1/2003 | Snyder |
| 6,507,215 | B1 | 1/2003 | Piasecki et al. |
| 6,507,857 | B1 | 1/2003 | Yalcinalp |
| 6,509,758 | B2 | 1/2003 | Piasecki et al. |
| 6,512,395 | B1 | 1/2003 | Lacey et al. |
| 6,516,428 | B2 | 2/2003 | Wenzel et al. |
| 6,522,128 | B1 | 2/2003 | Ely et al. |
| 6,523,416 | B2 | 2/2003 | Takagi et al. |
| 6,525,593 | B1 | 2/2003 | Mar |
| 6,526,556 | B1 | 2/2003 | Stoica et al. |
| 6,529,791 | B1 | 3/2003 | Takagi |
| 6,530,065 | B1 | 3/2003 | McDonald et al. |
| 6,534,970 | B1 | 3/2003 | Ely et al. |
| 6,535,061 | B2 | 3/2003 | Darmawaskita et al. |
| 6,535,200 | B2 | 3/2003 | Philipp |
| 6,535,946 | B1 | 3/2003 | Bryant et al. |
| 6,536,028 | B1 | 3/2003 | Katsioulas et al. |
| 6,539,534 | B1 | 3/2003 | Bennett |
| 6,542,025 | B1 | 4/2003 | Kutz et al. |
| 6,542,844 | B1 | 4/2003 | Hanna |
| 6,542,845 | B1 | 4/2003 | Grucci et al. |
| 6,546,297 | B1 | 4/2003 | Gaston et al. |
| 6,552,933 | B2 | 4/2003 | Roohparvar |
| 6,554,469 | B1 | 4/2003 | Thomson et al. |
| 6,556,044 | B2 | 4/2003 | Langhammer et al. |
| 6,557,164 | B1 | 4/2003 | Faustini |
| 6,559,685 | B2 | 5/2003 | Green |
| 6,560,306 | B1 | 5/2003 | Duffy et al. |
| 6,560,699 | B1 | 5/2003 | Konkle |
| 6,563,391 | B1 | 5/2003 | Mar |
| 6,564,179 | B1 | 5/2003 | Belhaj |
| 6,566,961 | B2 | 5/2003 | Dasgupta et al. |
| 6,567,426 | B1 | 5/2003 | van Hook et al. |
| 6,567,932 | B2 | 5/2003 | Edwards et al. |
| 6,570,557 | B1 | 5/2003 | Westerman et al. |
| 6,571,331 | B2 | 5/2003 | Henry et al. |
| 6,571,373 | B1 | 5/2003 | Devins et al. |
| 6,574,590 | B1 | 6/2003 | Kershaw et al. |
| 6,574,739 | B1 | 6/2003 | Kung et al. |
| 6,575,373 | B1 | 6/2003 | Nakano |
| 6,577,258 | B2 | 6/2003 | Ruha et al. |
| 6,578,174 | B2 | 6/2003 | Zizzo |
| 6,580,329 | B2 | 6/2003 | Sander |
| 6,581,191 | B1 | 6/2003 | Schubert et al. |
| 6,587,093 | B1 | 7/2003 | Shaw et al. |
| 6,587,995 | B1 | 7/2003 | Duboc et al. |
| 6,588,004 | B1 | 7/2003 | Southgate et al. |
| 6,590,422 | B1 | 7/2003 | Dillon |
| 6,590,517 | B1 | 7/2003 | Swanson |
| 6,590,589 | B1 | 7/2003 | Sluiman et al. |
| 6,591,369 | B1 | 7/2003 | Edwards et al. |
| 6,592,626 | B1 | 7/2003 | Bauchot et al. |
| 6,594,799 | B1 | 7/2003 | Robertson et al. |
| 6,597,212 | B1 * | 7/2003 | Wang et al. .................. 327/117 |
| 6,597,824 | B2 | 7/2003 | Newberg et al. |
| 6,598,178 | B1 | 7/2003 | Yee et al. |
| 6,600,346 | B1 | 7/2003 | Macaluso |
| 6,600,351 | B2 | 7/2003 | Bisanti et al. |
| 6,600,575 | B1 | 7/2003 | Kohara |
| 6,601,189 | B1 | 7/2003 | Edwards et al. |
| 6,601,236 | B1 | 7/2003 | Curtis |
| 6,603,330 | B1 | 8/2003 | Snyder |
| 6,603,348 | B1 | 8/2003 | Preuss et al. |
| 6,604,179 | B2 | 8/2003 | Volk et al. |
| 6,606,731 | B1 | 8/2003 | Baum et al. |
| 6,608,472 | B1 | 8/2003 | Kutz et al. |
| 6,610,936 | B2 | 8/2003 | Gillespie et al. |
| 6,611,220 | B1 | 8/2003 | Snyder |
| 6,611,276 | B1 | 8/2003 | Muratori et al. |
| 6,611,856 | B1 | 8/2003 | Liao et al. |
| 6,611,952 | B1 | 8/2003 | Prakash et al. |
| 6,613,098 | B1 | 9/2003 | Sorge et al. |
| 6,614,260 | B1 | 9/2003 | Welch et al. |
| 6,614,320 | B1 | 9/2003 | Sullam et al. |
| 6,614,374 | B1 | 9/2003 | Gustavsson et al. |
| 6,614,458 | B1 | 9/2003 | Lambert et al. |
| 6,615,167 | B1 | 9/2003 | Devins et al. |
| 6,617,888 | B2 * | 9/2003 | Volk .............................. 327/67 |
| 6,618,854 | B1 | 9/2003 | Mann |
| 6,621,356 | B2 | 9/2003 | Gotz et al. |
| 6,624,640 | B2 | 9/2003 | Lund et al. |
| 6,625,765 | B1 | 9/2003 | Krishnan |
| 6,628,163 | B2 | 9/2003 | Dathe et al. |
| 6,628,311 | B1 | 9/2003 | Fang |
| 6,631,508 | B1 | 10/2003 | Williams |
| 6,634,008 | B1 | 10/2003 | Dole |
| 6,634,009 | B1 | 10/2003 | Molson et al. |
| 6,636,096 | B2 | 10/2003 | Schaffer et al. |
| 6,636,169 | B1 | 10/2003 | Distinti et al. |
| 6,637,015 | B1 | 10/2003 | Ogami et al. |
| 6,639,586 | B2 | 10/2003 | Gerpheide |
| 6,642,857 | B1 | 11/2003 | Schediwy et al. |
| 6,643,151 | B1 | 11/2003 | Nebrigic et al. |
| 6,643,810 | B2 | 11/2003 | Whetsel |
| 6,649,924 | B1 | 11/2003 | Philipp et al. |
| 6,650,581 | B2 | 11/2003 | Hong et al. |
| 6,658,498 | B1 | 12/2003 | Carney et al. |
| 6,658,633 | B2 | 12/2003 | Devins et al. |
| 6,661,288 | B2 | 12/2003 | Morgan et al. |
| 6,661,410 | B2 | 12/2003 | Casebolt et al. |
| 6,661,724 | B1 | 12/2003 | Snyder et al. |
| 6,664,978 | B1 | 12/2003 | Kekic et al. |
| 6,664,991 | B1 | 12/2003 | Chew et al. |
| 6,667,740 | B2 | 12/2003 | Ely et al. |
| 6,670,852 | B1 | 12/2003 | Hauck |
| 6,671,869 | B2 | 12/2003 | Davidson et al. |
| 6,673,308 | B2 | 1/2004 | Hino et al. |
| 6,677,814 | B2 | 1/2004 | Low et al. |
| 6,677,932 | B1 | 1/2004 | Westerman |

| | | | | | | |
|---|---|---|---|---|---|---|
| 6,678,645 B1 | 1/2004 | Rajsuman et al. | | 6,823,282 B1 | 11/2004 | Snyder |
| 6,678,877 B1 | 1/2004 | Perry et al. | | 6,823,497 B2 | 11/2004 | Schubert et al. |
| 6,680,632 B1 | 1/2004 | Meyers et al. | | 6,825,689 B1 | 11/2004 | Snyder |
| 6,680,731 B2 | 1/2004 | Gerpheide et al. | | 6,825,869 B2 | 11/2004 | Bang |
| 6,681,280 B1 | 1/2004 | Miyake et al. | | 6,828,824 B2 | 12/2004 | Betz et al. |
| 6,681,359 B1 | 1/2004 | Au et al. | | 6,829,727 B1 | 12/2004 | Pawloski |
| 6,683,462 B2 | 1/2004 | Shimizu | | 6,834,384 B2 | 12/2004 | Fiorella, II et al. |
| 6,683,930 B1 | 1/2004 | Dalmia | | 6,836,169 B2 | 12/2004 | Richmond et al. |
| 6,686,787 B2 * | 2/2004 | Ling ........................ 327/203 | | 6,839,774 B1 | 1/2005 | Ahn et al. |
| 6,686,860 B2 | 2/2004 | Gulati et al. | | 6,842,710 B1 | 1/2005 | Gehring et al. |
| 6,690,224 B1 | 2/2004 | Moore | | 6,847,203 B1 | 1/2005 | Conti et al. |
| 6,691,193 B1 | 2/2004 | Wang et al. | | 6,850,117 B2 | 2/2005 | Weber et al. |
| 6,691,301 B2 | 2/2004 | Bowen | | 6,853,598 B2 | 2/2005 | Chevallier |
| 6,697,754 B1 | 2/2004 | Alexander | | 6,854,067 B1 | 2/2005 | Kutz et al. |
| 6,701,340 B1 | 3/2004 | Gorecki | | 6,856,433 B2 | 2/2005 | Hatano et al. |
| 6,701,487 B1 | 3/2004 | Ogami et al. | | 6,859,884 B1 | 2/2005 | Sullam |
| 6,701,508 B1 | 3/2004 | Bartz et al. | | 6,862,240 B2 | 3/2005 | Burgan |
| 6,703,961 B2 | 3/2004 | Mueck et al. | | 6,864,710 B1 | 3/2005 | Lacey et al. |
| 6,704,381 B1 | 3/2004 | Moyal et al. | | 6,865,429 B1 | 3/2005 | Schneider et al. |
| 6,704,879 B1 | 3/2004 | Parrish | | 6,865,504 B2 | 3/2005 | Larson et al. |
| 6,704,889 B2 | 3/2004 | Veenstra et al. | | 6,868,500 B1 | 3/2005 | Kutz et al. |
| 6,704,893 B1 | 3/2004 | Bauwens et al. | | 6,871,253 B2 | 3/2005 | Greeff et al. |
| 6,705,511 B1 | 3/2004 | Dames et al. | | 6,871,331 B1 | 3/2005 | Bloom et al. |
| 6,711,226 B1 | 3/2004 | Williams et al. | | 6,873,203 B1 | 3/2005 | Latham, II et al. |
| 6,711,731 B2 | 3/2004 | Weiss | | 6,873,210 B2 | 3/2005 | Mulder et al. |
| 6,713,897 B2 | 3/2004 | Caldwell | | 6,876,941 B2 | 4/2005 | Nightingale |
| 6,714,066 B2 | 3/2004 | Gorecki et al. | | 6,880,086 B2 | 4/2005 | Kidder et al. |
| 6,714,817 B2 | 3/2004 | Daynes et al. | | 6,888,453 B2 | 5/2005 | Lutz et al. |
| 6,715,132 B1 | 3/2004 | Bartz et al. | | 6,888,538 B2 | 5/2005 | Ely et al. |
| 6,717,474 B2 | 4/2004 | Chen et al. | | 6,892,310 B1 | 5/2005 | Kutz et al. |
| 6,718,294 B1 | 4/2004 | Bortfeld | | 6,892,322 B1 | 5/2005 | Snyder |
| 6,718,520 B1 | 4/2004 | Merryman et al. | | 6,893,724 B2 | 5/2005 | Lin et al. |
| 6,718,533 B1 | 4/2004 | Schneider et al. | | 6,894,928 B2 | 5/2005 | Owen |
| 6,724,220 B1 | 4/2004 | Snyder et al. | | 6,897,390 B2 | 5/2005 | Caldwell et al. |
| 6,725,441 B1 | 4/2004 | Keller et al. | | 6,898,703 B1 | 5/2005 | Ogami et al. |
| 6,728,900 B1 | 4/2004 | Meli | | 6,900,663 B1 | 5/2005 | Roper et al. |
| 6,728,902 B2 | 4/2004 | Kaiser et al. | | 6,901,014 B2 | 5/2005 | Son et al. |
| 6,730,863 B1 | 5/2004 | Gerpheide | | 6,901,563 B1 | 5/2005 | Ogami et al. |
| 6,731,552 B2 | 5/2004 | Perner | | 6,903,402 B2 | 6/2005 | Miyazawa |
| 6,732,068 B2 | 5/2004 | Sample et al. | | 6,903,613 B1 | 6/2005 | Mitchell et al. |
| 6,732,347 B1 | 5/2004 | Camilleri et al. | | 6,904,570 B2 | 6/2005 | Foote et al. |
| 6,738,858 B1 | 5/2004 | Fernald et al. | | 6,910,126 B1 | 6/2005 | Mar et al. |
| 6,744,323 B1 | 6/2004 | Moyal et al. | | 6,911,857 B1 | 6/2005 | Stiff |
| 6,745,369 B1 | 6/2004 | May et al. | | 6,917,661 B1 | 7/2005 | Scott et al. |
| 6,748,569 B1 | 6/2004 | Brooke et al. | | 6,922,821 B1 | 7/2005 | Nemecek |
| 6,750,852 B2 | 6/2004 | Gillespie | | 6,924,668 B2 | 8/2005 | Muller et al. |
| 6,750,876 B1 | 6/2004 | Atsatt et al. | | 6,934,674 B1 | 8/2005 | Douezy et al. |
| 6,750,889 B1 | 6/2004 | Livingston et al. | | 6,937,075 B2 | 8/2005 | Lim et al. |
| 6,754,101 B2 | 6/2004 | Terzioglu et al. | | 6,940,356 B2 | 9/2005 | McDonald et al. |
| 6,754,723 B2 | 6/2004 | Kato | | 6,941,336 B1 | 9/2005 | Mar |
| 6,754,765 B1 | 6/2004 | Chang et al. | | 6,941,538 B2 | 9/2005 | Hwang et al. |
| 6,754,849 B2 | 6/2004 | Tamura | | 6,944,018 B2 | 9/2005 | Caldwell |
| 6,757,882 B2 | 6/2004 | Chen et al. | | 6,949,811 B2 | 9/2005 | Miyazawa |
| 6,765,407 B1 | 7/2004 | Snyder | | 6,949,984 B2 | 9/2005 | Siniscalchi |
| 6,768,337 B2 | 7/2004 | Kohno et al. | | 6,950,954 B1 | 9/2005 | Sullam et al. |
| 6,768,352 B1 | 7/2004 | Maher et al. | | 6,950,990 B2 | 9/2005 | Rajarajan et al. |
| 6,769,622 B1 | 8/2004 | Tournemille et al. | | 6,952,778 B1 | 10/2005 | Snyder |
| 6,771,552 B2 | 8/2004 | Fujisawa | | 6,954,511 B2 | 10/2005 | Tachimori |
| 6,774,644 B2 | 8/2004 | Eberlein | | 6,954,904 B2 | 10/2005 | White |
| 6,781,456 B2 | 8/2004 | Pradhan | | 6,956,419 B1 | 10/2005 | Mann et al. |
| 6,782,068 B1 | 8/2004 | Wilson et al. | | 6,957,180 B1 | 10/2005 | Nemecek |
| 6,785,881 B1 | 8/2004 | Bartz et al. | | 6,957,242 B1 | 10/2005 | Snyder |
| 6,788,116 B1 | 9/2004 | Cook et al. | | 6,961,686 B2 | 11/2005 | Kodosky et al. |
| 6,788,221 B1 | 9/2004 | Ely et al. | | 6,963,233 B2 | 11/2005 | Puccio et al. |
| 6,788,521 B2 | 9/2004 | Nishi | | 6,963,908 B1 | 11/2005 | Lynch et al. |
| 6,791,377 B2 | 9/2004 | Ilchmann et al. | | 6,966,039 B1 | 11/2005 | Bartz et al. |
| 6,792,584 B1 | 9/2004 | Eneboe et al. | | 6,967,511 B1 | 11/2005 | Sullam |
| 6,798,218 B2 | 9/2004 | Kasperkovitz | | 6,967,960 B1 | 11/2005 | Bross et al. |
| 6,798,299 B1 | 9/2004 | Mar et al. | | 6,968,346 B2 | 11/2005 | Hekmatpour |
| 6,799,198 B1 | 9/2004 | Huboi et al. | | 6,969,978 B2 | 11/2005 | Dening |
| 6,806,771 B1 | 10/2004 | Hildebrant et al. | | 6,970,844 B1 | 11/2005 | Bierenbaum |
| 6,806,782 B2 | 10/2004 | Motoyoshi et al. | | 6,971,004 B1 | 11/2005 | Pleis et al. |
| 6,809,275 B1 | 10/2004 | Cheng et al. | | 6,973,400 B2 | 12/2005 | Cahill-O'Brien et al. |
| 6,809,566 B1 | 10/2004 | Xin-LeBlanc | | 6,975,123 B1 | 12/2005 | Malang et al. |
| 6,810,442 B1 | 10/2004 | Lin et al. | | 6,980,060 B2 | 12/2005 | Boerstler et al. |
| 6,815,979 B2 | 11/2004 | Ooshita | | 6,981,090 B1 | 12/2005 | Kutz et al. |
| 6,816,544 B1 | 11/2004 | Bailey et al. | | 6,988,192 B2 | 1/2006 | Snider |
| 6,817,005 B2 | 11/2004 | Mason et al. | | 6,996,799 B1 | 2/2006 | Cismas et al. |
| 6,819,142 B2 | 11/2004 | Viehmann et al. | | 7,005,933 B1 | 2/2006 | Shutt |

| | | |
|---|---|---|
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Seenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Seenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B2 | 8/2006 | Nemecek |
| 7,100,133 B1 | 8/2006 | Meiyappan et al. |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,868 B2 * | 11/2006 | Sanchez et al. ............... 330/256 |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Adreade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B2 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 7,809,545 B2 | 10/2010 | Ciofi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0066057 A1 | 4/2003 | RuDusky |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Moore et al. |

| | | | |
|---|---|---|---|
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2004/0018711 | A1 | 1/2004 | Madurawe |
| 2004/0054821 | A1 | 3/2004 | Warren et al. |
| 2004/0153802 | A1 | 8/2004 | Kudo et al. |
| 2004/0205553 | A1 | 10/2004 | Hall et al. |
| 2004/0205617 | A1 | 10/2004 | Light |
| 2004/0205695 | A1 | 10/2004 | Fletcher |
| 2005/0024341 | A1 | 2/2005 | Gillespie et al. |
| 2005/0066152 | A1 | 3/2005 | Garey |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0086668 | A1 | 4/2008 | Jefferson et al. |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |
| 2008/0294806 | A1 | 11/2008 | Swindle et al. |
| 2009/0066427 | A1 | 3/2009 | Brennan |
| 2009/0322305 | A1 | 12/2009 | De Cremoux |

FOREIGN PATENT DOCUMENTS

| | | |
|---|---|---|
| EP | 0308583 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |
| EP | 0639816 A2 | 2/1995 |
| EP | 0839816 A1 | 2/1995 |
| EP | 1170671 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

USPTO Notice of Allowance for U.S. Appl. No. 10/238,966 dated Jan. 27, 2009; 4 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Notice of Allowance for U.S. Appl. No. 10/001,477 dated Nov. 10, 2008; 7 pages.
USPTO Advisory Action for U.S. Appl. No. 10/001,477 dated Oct. 10, 2008; 3 pages.
USPTO Final Rejection for U.S. Appl. No. 10/001,477 dated Jun. 30, 2008; 15 pages.
USPTO Non-Final Rejection for U.S. Appl. No. 10/001,477 dated Dec. 6, 2007; 13 pages.
USPTO Final Rejection for U.S. Appl. No. 10/001,477 dated Jul. 23, 2007; 16 pages.
USPTO Non-Final Rejection for U.S. Appl. No. 10/001,477 dated Jan. 22, 2007; 15 pages.
USPTO Final Rejection for U.S. Appl. No. 10/001,477 dated Aug. 24, 2006; 13 pages.
USPTO Non-Final Rejection for U.S. Appl. No. 10/001,477 dated Mar. 2, 2006; 14 pages.
USPTO Final Rejection for U.S. Appl. No. 10/001,477 dated Oct. 24, 2005; 13 pages.
USPTO Non-Final Rejection for U.S. Appl. No. 10/001,477 dated May 11, 2005; 10 pages.
"Micropower CMOS Temperature Sensor with Digital Output;" Bakker et al., IEEE Journal of Solid-State Circuits, 1996; 3 pages.
"WP 3.5: An Integrated Time Reference;" Blauschild, Digest of Technical Papers, 1994; 4 pages.

"An Analog PPL-Based Clock and Data Recovery Circuit with High Input Jitter Tolerance;" Sun, Reprinted from IEEE Journal of Solid-State Circuits, 1989; 4 pages.

U.S. Appl. No. 09/842,966: "Precision Crystal Oscillator Circuit Used in Microcontroller," Mar; 28 pages.

U.S. Appl. No. 09/964,991: "A Novel Band-Gap Circuit for Providing an Accurate Reference Voltage Compensated for Process State, Process Variations and Temperature," Kutz et al.; 25 pages.

USPTO Non-Final Rejection for U.S. Appl. No. 09/975,115 dated Oct. 9, 2008; 34 pages.

USPTO Final Rejection for U.S. Appl. No. 09/975,115 dated May 12, 2008; 33 pages.

Uspto Non-Final Rejection for U.S. Appl. No. 09/975,115 dated Jan. 7, 2008; 30 page.

USPTO Non-Final Rejection for U.S. Appl. No. 09/975,115 dated Jul. 31, 2007; 28 pages.

USPTO Final Rejection for U.S. Appl. No. 09/975,115 dated Feb. 21, 2007; 25 pages.

USPTO Non-Final Rejection for U.S. Appl. No. 09/975,115 dated 1Oct. 31, 2006; 19 pages.

USPTO Final Rejection for U.S. Appl. No. 09/975,115 dated Jun. 23, 2006; 20 pages.

USPTO Non-Final Rejection for U.S. Appl. No. 09/975,115 dated Jan. 11, 2006; 15 pages.

USPTO Non-Final Rejection for U.S. Appl. No. 09/975,115 dated Jul. 27, 2005; 11 pages.

USPTO Non-Final Rejection for U.S. Appl. No. 09/975,115 dated Feb. 11, 2005; 86 pages.

USPTO Final Rejection for U.S. Appl. No. 09/975,338 dated Jan. 31, 2008; 21 pages.

USPTO Non-Final Rejection for U.S. Appl. No. 09/975,338 dated Aug. 14, 2007; 19 pages.

USPTO Final Rejection for U.S. Appl. No. 09/975,338 dated Feb. 27, 2007; 23 pages.

USPTO Non-Final Rejection for U.S. Appl. No. 09/975,338 dated Nov. 6, 2006; 11 pages.

USPTO Advisory Action for U.S Appl. No. 09/975,338 dated May 15, 2006; 4 pages.

USPTO Final Rejection for U.S Appl. No. 09/975,338 dated Jan. 18, 2006; 12 pages.

USPTO Non-Final Rejection for U.S Appl. No. 09/975,338 dated Apr. 5, 2005; 13 pages.

USPTO Final Rejection for U.S Appl. No. 10/008,096 dated Feb. 10, 2005; 15 pages.

USPTO Final Rejection for U.S Appl. No. 10/008,096 dated Jun. 16, 2008; 23 pages.

USPTO Final Rejection for U.S Appl. No. 10/008,096 dated Sep. 4, 2007; 19 pages.

USPTO Final Rejection for U.S. Appl. No. 10/008,096 dated Oct. 13, 2006; 17 pages.

USPTO Final Rejection for U.S. Appl. No. 10/008,096 dated Nov. 25, 2005; 17 pages.

USPTO Non-Final Rejection for U.S. Appl. No. 10/008,096 dated Mar. 7, 2007; 19 pages.

USPTO Non-Final Rejection for U.S. Appl. No. 10/008,096 dated Apr. 17, 2006; 18 pages.

USPTO Non-Final Rejection for U.S. Appl. No. 10/008,096 dated Jun. 14, 2004; 24 pages.

USPTO Non-Final Rejection for U.S. Appl. No. 10/008;096 dated Jun. 24, 2005: 15 pages.

USPTO Non-Final Rejection for U.S. Appl. No. 10/008,096 dated Dec. 12, 2007; 14 pages.

USPTO Notice of Allowance for U.S. Appl. No. 10/008,096 dated Dec. 22, 2008; 24 pages.

USPTO Notice of Allowance for U.S. Appl. No. 091975,105 dated Dec. 4, 2006; 4 pages.

USPTO Final Rejection for U.S. Appl. No. 09/975,105 dated Jul. 13, 2006; 7 pages.

USPTO Non-Final Rejection for U.S. Appl. No. 09/975,105 dated Jan. 19, 2006; 5 pages.

USPTO Non-Final Rejection for U.S. Appl. No. 09/975,105 dated Apr. 19, 2005; 9 pages.

U.S. Appl. No. 09/943,062: "Apparatus and Method for Programmable Power Management in a Programmable Analog Circuit Block:" Mar; 46 pages.

U.S. Appl. No. 10/238,966: "Method for Parameterizing a User Module;" Perrin; 41 pages.

USPTO Notice of Allowance for U.S. Appl. No. 10/324,455 dated Feb. 12, 2004; 4 pages.

USPTO Non-Final Rejection for U.S. Appl. No. 10/324,455 dated Nov. 6, 2003; 4 pages.

USPTO Non-Final Rejection for U.S. Appl. No. 10/324,455 dated Aug. 21, 2003; 4 pages.

USPTO Notice of Allowance for U.S. Appl. No. 09/998,859 dated Mar. 14, 2005; 6 pages.

USPTO Non-Final Rejection for U.S. Appl. No. 09/998,859 dated Nov. 4, 2004; 6 pages.

USPTO Final Rejection for U.S. Appl. No. 09/998,859 dated Nov. 19, 2003; 5 pages.

USPTO Non-Final Rejection for U.S. Appl. No. 09/998,859 dated May 28, 2003; 6 pages.

USPTO Non-Final Rejection for U.S. Appl. No. 09/998,859 dated May 15, 2003; 6 pages.

USPTO Notice of Allowance for U.S. Appl. No. 09/998.834 dated May 19, 2005; 7 pages.

USPTO Non-Final Rejection for U.S. Appl. No. 09/998,834 dated Sep. 20, 2004; 11 pages.

USPTO Notice of Allowance for U.S. Appl. No. 10/113,065 dated Apr. 6, 2006; 8 pages.

USPTO Final Rejection for U.S. Appl. No. 10/113,065 dated Oct. 26, 2005; 17 pages.

USPTO Non-Final Rejection for U.S. Appl. No. 10/113,065 dated May 20, 2005; 14 pages.

U.S. Appl. No. 09/207,912: "Circuit(s), Architecture and Method(s) for Operating and/or Tuning a Ring Oscillator;" Mar; 23 pages.

USPTO Notice of Allowance for U.S. Appl. No. 10/001,477 dated May 8, 2009; 6 pages.

From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.

From U.S. Appl. No. 10/033,027: Harbaum, T. et al. "Design of a Flexible Coprocessor Unit" Proceedings of the Euromicro Conference, XX XX, Sep. 1999; 10 pages.

From U.S. Appl. No. 10/033,027: "Programmable Microcontroller (PSoC) Architecture (Mixed Analog/ Digital)"; Aug. 7, 2001; U.S. Appl. No. 09/924,734 Snyder et al.; 28 pages.

From U.S. Appl. No. 10/033,027: "Digital Configurable Macro Architecture"; Jul. 18, 2001; U.S. Appl. No. 09/909,045; Snyder; 37 pages.

From U.S. Appl. No. 10/033,027; "Configuring Digital Functions in a Digital Configurable Macro Architecture"; Jul. 18, 2001; U.S. Appl. No. 09/909,109; Snyder; 38 pages.

From U.S. Appl. No. 10/033,027: "A Programmable Analog System Architecture (As Amended)"; Jul. 18, 2001; U.S. Appl. No. 09/909,047; Mar; 60 pages.

From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.

From U.S. Appl. No. 10/033,027: CD00175; "Method for Synchronizing and Resetting Clock Signals Supplied to Multiple Programmable Analog Blocks (As Amended)"; Oct. 1, 2001; U.S. Appl. No. 09/969;311; Sullam; 57 pages.

From U.S. Appl. No. 10/033,027: "Method and Apparatus for Programming a Flash Memory"; Jun. 5, 2001; U.S. Appl. No. 09/875,599; Snyder; 23 pages.

From U.S. Appl. No. 10/033,027: "In-System Chip Emulator Architecture"; Oct. 10, 2001; U.S. Appl. No. 09/975,115; Snyder et al.; 38 pages.

From U.S. Appl. No. 10/033,027: "A Configurable Input/Output interface for a Microcontroller"; Sep. 14, 2001; U.S. Appl. No. 09/953,423; Kutz et al.; 28 pages.

From U.S. Appl. No. 10/033,027: "Multiple Use of Microcontroller Pad"; Jun. 26, 2001; U.S. Appl. No. 09/893,050; Kutz et al.; 21 pages.

From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Analog Blocks"; Oct. 1, 2001; U.S. Appl. No. 09/969,313; Sullam; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al,; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The Provisional Application U.S. Appl. No. 60/243,708 "Advanced Programmable Microcontroller Device"; 277 pages.
"Webster's Third New International Dictionary", 1996, G. & C. Merriam Company; 3 pages.
USPTO Advisory Action for U.S. Appl. No. 09/998,848 dated Sep. 7, 2005; 3 pages.
U.S. Appl. No. 09/957,084: "A Crystal-Less Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode;" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks:" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and Pod Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 09/922,419: "A Power Supply Pump Circuit for a Microcontroller;" Kutz; 38 pages.
U.S. Appl. No. 09/922,579: "A Method for a Efficient Supply to a Microcontroller;" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; 2 pages.
Anonymous, "F/Port:Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE; Jun. 21-23, 2000; 6 pages.
Hong et al.; "An FPGA-Based Hardware Emulator for Fast Fault Emulation"; IEEE 1997; 4 pages.
Ching et al; "An In-Curcuit-Emulator for TMS320C25"; IEEE 1994; 6 pages.
Pasternak; "In-Circuit-Emulation in ASIC Architecture Cor Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages.
Anonymous; "JEEN JTAG Embedded Ice Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with the GNU Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection—Introduction—Smithsonian Institute"; "State of the Art"; "The First 256-Bit Static Ram"; retrieved on Nov. 14, 2005 from http://smithsonianchips.si.edu/augarten/p24.htm; 2 pages.
"POD—Piece of Data, Plain Old Documentation, Plain Old Dos . . . "; retrieved on Nov. 14, 2005 from http://www.auditmypc.com/acronym/Pod,asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.

USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www.algonet.se/~staffann/developer/emulator.htm; 6 pages.
"Capturing Test/Emulation and Enabling Real-Time Debugging Using FPGA for In-Circuit Emulation;" Oct. 10,2001; U.S. Appl. No. 09/975,104; Snyder; 35 pages.
USPTO Non-Final Rejection for U.S. Appl. No. 09/989,767 dated Jul. 24, 2008; 21 pages.
Anonymous; "Using Debug"; 1999; Prentice-Hail Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages.
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.
"Emulator Chip-Board Architecture for Interface;" Oct. 10, 2001; U.S. Appl. No. 09/975,030; Snyder et al.; 37 pages.
Wikipedia—Main Page, retrieved on Mar. 8, 2006 from http://en.wikipedia.org/wiki/Main_Page and http://en.wikipedia.org/wiki/Wikipedia: Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcle Microprocessor with the Mit Virtual Wires Emulation System"; 1994; IEEE; 9 pages.
Bauer et al.; "A Reconfigurable Logic Machine for Fast Event-Driven Simulation"; 1998; Design Automation Conference Proceedings; 8 pages.
"Host to FPGA Interface in an In-Circuit Emulation System," Oct. 10, 2001; U.S. Appl. No. 09/975,105; Nemecek; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/992,076 dated Aug. 10, 2006); 19 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
UPSTO Advisory Action for U.S. Appl. No.09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848) dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.

USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Non-Final Rejection for U.S. Appl. No. 09/989,767 dated Jul. 2, 2007; 22 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 ddated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 13 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faura et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems., Cypress Microsystems, Inc, CMS10006A, Jul. 3, 2001; 25 pages.
"PSoC technology complete changes 8-bit MCU system design", Cypress Microsystems, Inc. retrieved from <http:// www.archive.org/web/20010219005250/http://cypressmicro.com-/t . . . >, Feb. 19, 2001; 21 pages.
Specks et al., "A Mixed Digital-Analog 16B Microcontroller with 0.5MB Flash Memory, On-Chip Power Supply, Physical Newark Interface, and 40V I/O for Automotive Single-Chip Mechatronics," IEEE, Feb, 9, 2000; 1 page.
Hsieh et al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for U.S. Appl. No. 09/989;777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
U.S. Appl. No.10/033,027: "Microcontrollable Programmable System on a Chip;" Snyder; 117 pages.
U.S. Appl. No. 10/803,030: "Programmable Microcontrollable Architecture (Mixed Analog/Digital);" Snyder; 13 pages.
"New Object Domain R3 Beta Now Available (Build 134)!" Mar. 13, 2001; <http://web.archive.org/web/200100331202605/www.objectdomain.com/dornain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XLM" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level of System Flexibility"; Electronic Design; Nov. 6, 2000; 11 pages.
Cypress MicroSystem, Inc. "Cypres Customer Forums" retrieved from <http://www.cypress.com/forums/messageview>; 1 page.

Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CYAnnounces_nov_13_2000.html>; 3 pages.
Huang at al., Iceberg, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062) dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages.
USPTO Notice of Allowance for U.S. Appl. No. 09/930,021 dated 11/261,2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2006; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.

USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004: 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et at, "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information Ltd; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815: "A Data Driven Method and System for Monitoring Hardware Resource Usage for Programming an Electric Device;" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007: 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress:" Nemecek; 33 pages.
U.S. Appl. No. 09/998,834: "A System and a Method for Communication between an Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
U.S. Appl. No. 11/322,044, filed Dec. 28, 2005, Stiff, Jonathan.
U.S. Appl. No. 11/850,260: "Circuit and Method for Improving the Accuracy of a Crystal-less Oscillator Having Dual-Frequency Modes;" Wright et al.; 33 pages.

USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009: 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Non-Final Rejection for U.S. Appl. No. 10/226,911 dated Mar. 19, 2004; 6 pages.
USPTO Notice of Allowance for U.S. Appl. No. 10/226,911 dated Aug. 20, 2004; 4 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 09/404,891: "Method, Architecture and Circuitry for Controlling Pulse Width in a Phase and/or Frequency Detector," Scott et al.; 17 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,444 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044; "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson. "A Feb. 1600-MHz CMOS Clock Recovery PLL1 with Low-Vdd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.

USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 10/226,911; "Calibration of Integrated Circuit Time Constants," Gehring et al.; 32 pages.
USTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al.; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914: "Reference-Free Clock Generator and Data Recovery PLL," Dalmia et al.; 32 pages.
U.S. Appl. No. 09/471,576: "Reference-Free Clock Generation and Data Recovery PLL," Dalmia; 30 pages.
U.S. Appl. No.10/083,442: "Method/Architecture for a Low Gain PLL with Wide Frequency Range," Meyers et al.; 28 pages.
U.S. Appl. No. 09/470,665; "Digital Phase/Frequency Detector, and Clock Generator and Data Recovery PLL Containing the Same," Dalmia; 26 pages.
U.S. Appl. No. 09/893,161: "Architecture of a PLL with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquisition Rate Control in Phase Lock Loop Circuits," Moyal et al.; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989; "Memory Based Phase Locked Loop," Krishnan; 27 pages.
U.S. Appl. No. 09/048,905: "Programmable Clock Generator," Mann et al.; 42 pages.
U.S. Appl. No.. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 101293,392 dated Oct. 16, 2003; 6 pages.

U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method," Roper et al.; 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No.09/989,819: "System and method for creating a boot file utilizing a boot template," Ogami at al.; 43 pages.
USPTO Notice of Allowance for U.S. Appl. No. 09/989,761 dated Jan. 14, 2005; 6 pages.

USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 091989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac at al. "Symbolic Computation of Digital Filter Transfer Function Using MATLAB," Proceedings of 23rd International Conference on Microelectronics (MIEL 2002), vol. 2 NIS, Yugoslavia; 4 pages.
Nouta et al. "Design and Fpga-Implementation of Wave Digital Bandpass Filters with Arbitrary Amplitude Transfer Characteristics," Proceedings of IEEE International Symposium on Industrial Electronics; 1998, Vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition;" Jan. 16, 1997; <http://www.cs.sfu.ca/cs/people/GradStudent.html; 1 page.
Ebeling et al., "Validating VLSI Circuit Layout by Wirelist Comparison;" Sep. 1983; in proceedings of the IEEE International Conference on Computer Aided Design (ICCAD-83); 2 pages.
Ohirich et al,, "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
USPTO U.S. Appl. No. 12/132,527: "System and Method for Performing Next Placements and Pruning of Disallowed Placements for Programming an Integrated Circuit;" Ogami et al., filed on Jun. 3, 2008; 44 pages.
U.S. Appl. No. 12/356,468: "System and Method for Dynamically Generating a Configuration Datasheet," Anderson at al.; filed on Jan. 20, 2009; 27 pages.
International Search Report from the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 091475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
U.S. Appl. No. 09/475,879: "Programmable Logic Device," Lacey at al.; filed on Dec. 30, 1999; 50 pages.
USPTO U.S. Appl. No. 09/475,808: "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
U.S. Appl. No.10/137,497: "Reconfigurabie Testing System and Method," Pleis et al.; filed on May, 10, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for Application No. 10/137,497 dated Jan. 24, 2007; 12 pages.
USPTO Notice of Allowance for U.S. Appl. No. 10/137,497 dated Jul. 20, 2007; 4 pages.
U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
U.S. Appl. No. 10/172,670: "Method and System for Programming a Memory Device," Snyder et al.; filed on Jun. 13, 2002; 66 pages.
U.S. Appl. No. 11/986,338: Reconfigurable Testing System and Method, Pleis et al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
USPTO U.S. Appl. No. 11/273,708: "Capacitance Sensor Using Relaxation Oscillators," Snyder et al., filed on Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit;" Warren Snyder, filed on Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 111337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.

USPTO U.S. Appl. No. 11/983,291: "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO U.S. Appl. No. 11/698,660: "Configurable Bus," Katz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866: "Input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>: retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse interface," PS/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
USPTO U.S. Appl. No. 11/166,622: "Touch wake for electronic devices," Beard et al., filed on Jun. 23, 2005; 22 pages.
International Written Opinion of the International Searching Authority for International Application No. PCT/US2006109572 dated Jan. 10, 2008; 5 pages.
International Search Report for International Application No. PCT/US2006/09572 dated Jan. 10, 2008; 2 pages.
USPT Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
U.S. Appl. No. 11/088,028: "Method and Circuit for Rapid Alignment of Signals," Moyal et al., filed on Nov. 13, 2007; 34 pages.
USPT Notice of Allowance for U.S. Appl. No. 11/088,028 dated Jul. 2, 2007; 6 pages.
USPT Notice of Allowance for U.S. Appl. No. 11/088,028 dated Jan. 26, 2007; 6 pages.
USPT Non-Final Rejection for U.S. Appl. No. 11/088,028 dated Jun. 16, 2006; 8 pages.
U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009: 7 pages.
USPTO Requirement for Restriction for U.S. Appl. No. 11/985,340 dated Mar. 16, 2009: 7 pages.
USPTO Non-Final Rejection for U.S. Appl. No. 11/865,672 dated Jul. 17, 2009; 6 pages.

USPTO Non-Final Rejection for U.S. Appl. No. 11/859,547 dated Oct.01, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009: 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE-transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/USO8/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International Application No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 101238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 101001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.

USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No.09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No.10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Final Rejection for U.S. Appl. No. 09/989,767 dated Dec. 7, 2009; 22 pages.
USPTO Final Rejection for U.S. Appl. No. 11/850,260 dated Aug. 21, 2009; 9 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance fo rU.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 ated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Non-Final Rejection for U.S. Appl. No. 10/133,581 dated Feb. 24, 2006; 11 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated 11/2712007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.

USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
"The Gemini Netlist Comparison Project;" <http://www.cs.washington.edu/research/projects/lis/www/gemini/gemini.html> larry@cs.washington.edu; Mar. 19, 2002; 2 pages.
Sedra et al., "Microelectronic Circuits," 3rd Edition, 1991, Oxford University Press, Feb. 5, 2007; 20 pages.
USPTO Non-Final Rejection for U.S. Appl. No. 12/132,527 dated Apr. 29, 2010; 7 pages.
USPTO Final Rejection for U.S. Appl. No. 11/818,005 dated May 24, 2010; 8 pages.
USPTO Notice of Allowance for U.S. Appl. No. 09/943,062 dated Jun. 29, 2010; 4 pages.
USPTO Non-Final Rejection for U.S. Appl. No. 11/201,922 dated Jun. 11, 2010; 12 pages.
USPTO Non-Final Rejection for U.S. Appl. No. 12/070,547 dated Jun. 3, 2009; 6 pages.
USPTO Final Rejection for U.S. Appl. No. 12/070,547 dated Oct. 30, 2009; 5 pages.
USPTO Notice of Allowance for U.S. Appl. No. 12/070,547 dated Feb. 24, 2010; 4 pages.
USPTO Non-Final Rejection for U.S. Appl. No. 11/347,189 dated Jun. 8, 2007; 6 pages.
USPTO Notice of Allowance for U.S. Appl. No. 11/347,189 dated Sep. 27, 2007; 4 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 ted Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Mooris Mano, "Computer System Achtecture" 1982, Prentice-Hall, 2nd Edtion, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/print/0804/eady169/2.htm>; 4 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
U.S. Appl. No. 12/058,586: "System and Method for Monitoring a Target Device," Ogami et al., filed on Mar. 28, 2008; 41 pages.
U.S. Appl. No. 12/058,534: "Sysem and Mehod for Contoling a Tage Device," Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 12/058,569: "Confguraion of Pogammable IC Design Elemens"Best et al., filed on Mar. 28, 2008; 19 pages.
U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed SOC 320 Embedded Storage Switch," 2003, Vixel, pp. 1-5; 5 pages.
USPTO Notice of Allowance for U.S. Appl. No. 09/943,062 dated Jun. 29, 2010; 4 pages.
USPTO Miscellaneous Action for U.S. Appl. No. 10/113,581 dated Jun. 23, 2010; 6 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.

USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Advisory Action for U.S. Appl. No. 11/818,005 dated Jul. 30, 2010; 3 pages.
USPTO Non-Final Rejection for U.S. Appl. No. 12/132,527 dated Apr. 29, 2010; 7 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pags.
USPTO Non-Final Rejection for U.S. Appl. No. 11/857,947 dated Jul. 21, 2010; 15 pages.
USPTO Non-Final Rejection for U.S. Appl. No. 12/058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 11/968,145 dated Mar. 4, 2010; 11 pages.
USPTO Non-Final Rejection for U.S. Appl. No. 12/104,678 dated Jul. 2, 2010; 8 pages.
USPTO Advisory Action for U.S. Appl. No. 11/779,439 dated Mar. 30, 2009; 3 pages.
USPTO Notice of Allowance for U.S. Appl. No. 10/001,478 dated Sep. 7, 2010; 10 pages.
USPTO Notice of Allowance for U.S. Appl. No. 11/818,005 dated Oct. 26, 2010; 10 pages.
USPTO Final Rejection for U.S. Appl. No. 12/132,527 dated Oct. 14, 2010; 8 pages.
USPTO Non-Final Rejection for U.S. Appl. No. 11/201,627 dated Sep. 30, 2010; 6 pages.
USPTO Final Rejection for U.S. Appl. No. 11/698,660 dated Sep. 3, 2010; 19 pages.
USPTO Advisory Action for U.S. Appl. No. 11/698,660 dated Nov. 10, 2010; 3 pages.
USPTO Non-Final Rejection for U.S. Appl. No. 11/644,100 dated Sep. 15, 2010; 10 pages.
USPTO Non-Final Rejection for U.S. Appl. No. 11/201,922 dated Jun. 11, 2010; 12 pages.
USPTO Final Rejection for U.S. Appl. No. 12/060,176 dated Oct. 12, 2010; 22 pages.
USPTO Advisory Action for U.S. Appl. No. 12/136,577 dated Oct. 29, 2010; 3 pages.
USPTO Non-Final Rejection for U.S. Appl. No. 11/644,100 dated Dec. 16, 2009; 13 pages.
USPTO Final Rejection for U.S. Appl. No. 11/166,622 dated Mar. 18, 2010; 12 pages.
USPTO Advisory Action for U.S. Appl. No. 09/994,601 dated Mar. 23, 2010; 2 pages.
USPTO Non-Final Rejection for U.S. Appl. No. 11/818,005 dated Oct. 26, 2010; 10 pages.
USPTO Final Rejection for U.S. Appl. No. 12/132,527 dated Oct. 14, 2010; 8 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 23, 2010; 6 pages.
USPTO Notice of Allowance for U.S. Appl. No. 10/113,581 dated Sep. 3, 2010; 11 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed on Mar. 28, 2008; 56 pages.
USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.

USPTO Non-Final Rejection for U.S. Appl. No. 11/698,660 dated Dec. 13, 2010; 20 pages.
USPTO Notice of Allowance for U.S. Appl. No. 11/644,100 dated Jan. 6, 2011; 6 pages.
USPTO Non-Final Rejection for U.S. Appl. No. 11/201,922 dated Dec. 28, 2010; 14 pages.
USPTO Final Rejection for U.S. Appl. No. 11/166,622 dated Dec. 7, 2010; 12 pages.
USPTO Non-Final Rejection for U.S. Appl. No. 11/166,622 dated Jun. 22, 2010; 11 pages.
USPTO Final Rejection for U.S. Appl. No. 09/989,771 dated Jan. 4, 2011; 12 pages.
USPTO Non-Final Rejection for U.S. Appl. No. 09/975,338 dated Apr. 30, 2010; 10 pages.
USPTO Non-Final Rejection for U.S. Appl. No. 11/818,005 dated Oct. 26, 2010; 10 pages.
USPTO Non-Final Rejection for U.S. Appl. No. 11/968,145 dated Jan. 5, 2011; 8 pages.
USPTO Non-Final Rejection for U.S. Appl. No. 12/004,833 dated Dec. 21, 2010; 8 pages.
USPTO Notice of Allowance for U.S. Appl. No. 12/058,569 dated Dec. 13, 2010; 6 pages.
USPTO Non-Final Rejection for U.S. Appl. No. 09/989,782 dated Oct. 27, 2009; 9 pages.
USPTO Final Rejection for U.S. Appl. No. 12/104,678 dated Dec. 3, 2010; 9 pages.
USPTO Final Rejection for U.S. Appl. No. 11/857,947 dated Jan. 4, 2011; 14 pages.
USPTO Notice of Allowance for U.S. Appl. No. 09/975,115 dated May 9, 2011; 11 pages.
USPTO Non-Final Rejection for U.S. Appl. No. 10/033,027 dated Mar. 15, 2011; 6 pages.
USPTO Notice of Allowance for U.S. Appl. No. 11/818,005 dated Mar. 23, 2011; 7 pages.
USPTO Requirement Restriction for U.S. Appl. No. 12/356,468 dated Apr. 22, 2011; 7 pages.
U.S. Appl. No. 12/356,468: "System and Method for Dynamically Generating a Configuration Datasheet," Anderson et al., filed on Jan. 20, 2009; 69 pages.
USPTO Notice of Allowance for U.S. Appl. No. 09/998,848 dated Feb. 17, 2011; 7 pages.
USPTO Non-Final Rejection for U.S. Appl. No. 12/136,557 dated May 5, 2011; 7 pages.
USPTO Non-Final Rejection for U.S. Appl. No. 09/975,338 dated Apr. 30, 2010; 2 pages.
USPTO Non-Final Rejection for U.S. Appl. No. 12/789,399 dated Mar. 10, 2011; 14 pages.
U.S. Appl. No. 12/789,399: "Model for a Hardware Device-Independent Method of Defining Embedded Firmware for Programmable Systems," McDonald et al., filed on May 27, 2010; 32 pages.
USPTO Notice of Allowance for U.S. Appl. No. 11/166,622 dated Apr. 15, 2011; 5 pages.
USPTO Final Rejection for U.S. Appl. No. 11/698,660 dated Apr. 4, 2011; 20 pages.
USPTO Notice of Allowance for U.S. Appl. No. 11/865,672 dated Mar. 2, 2011; 8 pages.
USPTO Notice of Allowance for U.S. Appl. No. 11/857,947 dated Mar. 30, 2011; 8 pages.
USPTO Notice of Allowance for U.S. Appl. No. 12/058,569 dated Apr. 11, 2011; 7 pages.
USPTO Non-Final Rejection for U.S. Appl. No. 12/060,176 dated Apr. 6, 2011; 23 pages.
USPTO Notice of Allowance for U.S. Appl. No. 12/104,672 dated Feb. 14, 2011; 9 pages.
USPTO Advisory Action for U.S. Appl. No. 12/104,678 dated Feb. 16, 2011; 5 pages.

* cited by examiner

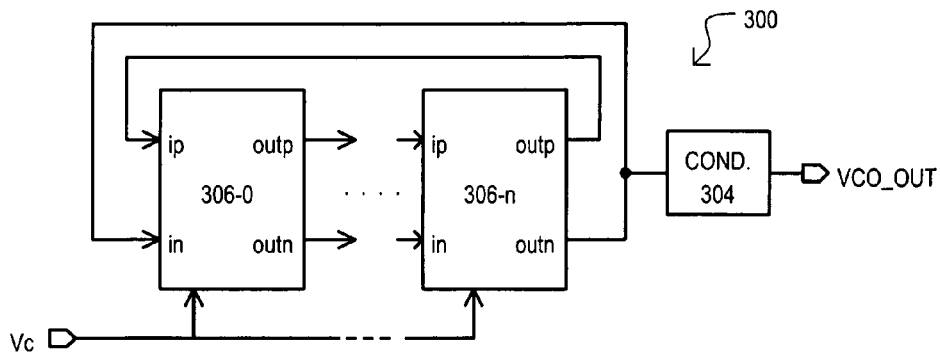
FIG. 3
| Control voltage | Old circuit frequency (MHz) | New circuit (R2=75Ω) frequency (MHz) | New circuit (R2=150Ω) frequency (MHz) |
|---|---|---|---|
| 100m | 447.2 | 440 | 438.0 |
| 105m | 427.6 | 420.5 | 418.6 |
| 110m | 409.5 | 402.5 | 400.6 |
| 115m | No oscillations | 386.0 | 384.1 |
| 120m | No oscillations | 370.8 | 369.0 |
| 125m | No oscillations | 357.1 | 355.3 |
| 130m | No oscillations | 344.7 | 343.0 |
| 135m | No oscillations | 333.6 | 331.9 |
| 140m | No oscillations | No oscillations | 322.2 |
| 145m | No oscillations | No oscillations | 313.5 |
| 150m | No oscillations | No oscillations | 306.0 |
FIG. 4
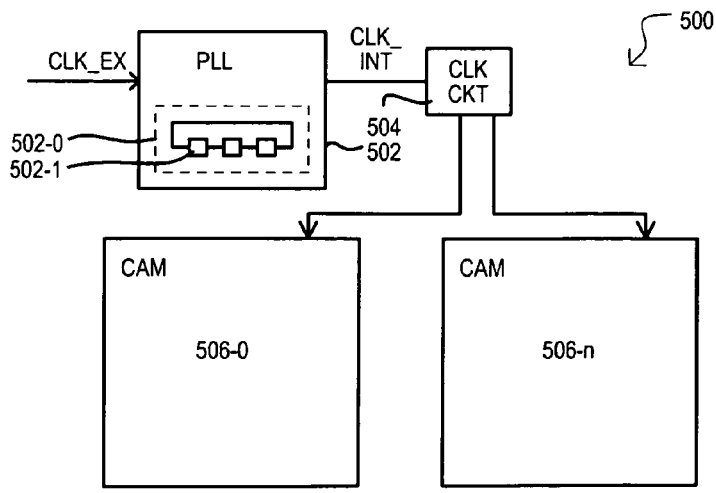
FIG. 5

VOLTAGE CONTROLLED OSCILLATOR DELAY CELL AND METHOD

This application is a continuation of U.S. patent application Ser. No. 11/415,588, filed May 1, 2006 which issued as U.S. Pat. No. 7,400,183 on Jul. 15, 2008, filed on May 1, 2006 and which claims the benefit of U.S. provisional patent application Ser. No. 60/678,397, filed May 5, 2005. The contents of both of these applications are incorporated by reference herein.

TECHNICAL FIELD

The present invention relates generally to delay circuits, and more particularly to a voltage controlled delay circuit for use in a voltage controlled oscillator.

BACKGROUND OF THE INVENTION

Phase locked loop (PLL) circuits can be utilized in a wide variety of applications, including timing applications for integrated circuits. A typical PLL can include a phase detector that determines a phase difference between a received signal and a feedback signal, a loop filter that can derive a control voltage from the phase difference indicated by the phase detector, and a voltage controlled oscillator (VCO) that can generate a feedback signal having an oscillation frequency corresponding to the control voltage. In some arrangements, the VCO output signal may be frequency divided before being returned to the phase detector.

A VCO can take many forms. In one particular configuration, a VCO can utilize a "ring" oscillator. A ring oscillator can include a number of delay stages (i.e. cells) configured in series and fed back to form a ring. Typically, a ring oscillator includes an odd number or inverting stages. In this way, a signal propagating through the ring can be inverted by such stages and the negative feedback feature of having an odd number of stages generates an oscillation. In a VCO application, a delay introduced by each stage can be established according to a control voltage to thereby generate an oscillation based on the control voltage.

In many applications, a VCO can be the most critical portion of a PLL. For example, in some applications it may be desirable for a PLL circuit to have a wide input/output frequency range without having to adjust/include divider circuits. In such a case, a VCO response can limit the range over which a PLL can operate.

A conventional delay cell of a VCO is set forth in FIG. 6 and designated by the general reference character 600. Conventional VCO delay cell 600 can include a differential stage 602 and a cross-coupled stage 604. Conventional VCO delay cell 600 receives a differential input voltage (ip and in) and provides a differential output voltage (outp and outn).

Differential stage 602 can include transistors (M1 and M2) that form a differential pair, a resistor-capacitor load (RL and CL), and a variable current source 606. Transistors (M1 and M2) receive differential input voltage (ip and in) at respective gate terminals. Transistor M1 has a drain connected to the first differential output node outp and a source commonly connected to the source of transistor M2. Transistor M2 has a drain connected to the second differential output node outn. A resistor-capacitor load (RL and CL) is connected to each differential output node (outn and outp). Variable current source 606 is connected between the common source node of transistors (M1 and M2) and a ground.

Differential stage draws a current shown as current I0. Current I0 is the combined current through transistors (M1 and M2).

Variable current source 606 includes a constant current component that draws a current (2I) and a variable current component that provides a current (I/2−Ivc, where Ivc is a voltage controlled current).

Cross-coupled stage 604 can include cross-coupled transistors (M3 and M4) and variable current source 608. Transistor M3 has a drain connected to differential output node outp, a gate connected to differential output node outn, and a source commonly connected to a source of transistor M3. Transistor M4 has a drain connected to differential output node outn and a gate connected to differential output node outp. Variable current source 608 is connected between commonly connected sources of transistors (M3 and M4) and a ground.

Cross-coupled stage draws a current shown as current I1. Current I1 is the combined current through transistors (M3 and M4).

Variable current source 608 includes a constant current component that draws a current (I) and a variable current component that provides a current (I/2+Ivc, where Ivc is a voltage controlled current).

In a conventional VCO employing a conventional VCO delay cell 600 as illustrated in FIG. 6, an output frequency can be proportional to 1/(RL*CL), where RL is the resistance value of load resistor RL and CL is the capacitance value of load capacitor CL, and currents I0/I1 at a fixed control voltage Vc. The current Ivc can be proportional to a control voltage Vc in a range of −I/2 to I/2.

In the conventional case shown, at a maximum frequency, a current Ivc=I/2, and essentially all current drawn can be through the differential pair (M1 and M2) of differential stage 602 and essentially no current is drawn through cross-coupled pair (M3 and M4) of cross-coupled stage 604 (i.e., I0=2I and I1=0). At a minimum frequency, current Ivc=−I/2, and essentially equal current can flow through both differential pair (M1 and M2) of differential stage 602 and cross-coupled pair (M3 and M4) of cross-coupled stage 604 (i.e., I0=I1=I).

A drawback to conventional VCO delay cell 600 is that the tuning range (range of frequencies at which a lock can occur) can be limited unless post VCO voltage dividers are adjusted. In particular, a lower frequency range may be limited. If a ratio between current (I0) sourced by differential pair (M1 and M2) and current (I1) sourced by cross-coupled pair (M3 and M4) falls below one, a ring oscillator may cease oscillating.

In light of the above, it would be desirable to provide a VCO delay cell that may be employed in a ring type oscillator that can provide a wider frequency tuning range than a conventional VCO delay cell.

BRIEF DESCRIPTION OF THE DRAWINGS

FIG. 3 is a block schematic diagram of a ring oscillator circuit according to an embodiment.

FIG. 4 is a table of simulation results of a ring oscillator circuit including a conventional delay cell circuit and a delay cell circuit according to an embodiment.

FIG. 5 is a block schematic diagram of a content addressable memory (CAM) according to an embodiment.

DETAILED DESCRIPTION OF THE EMBODIMENTS

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques may not be shown in detail or may be shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Figure 1:
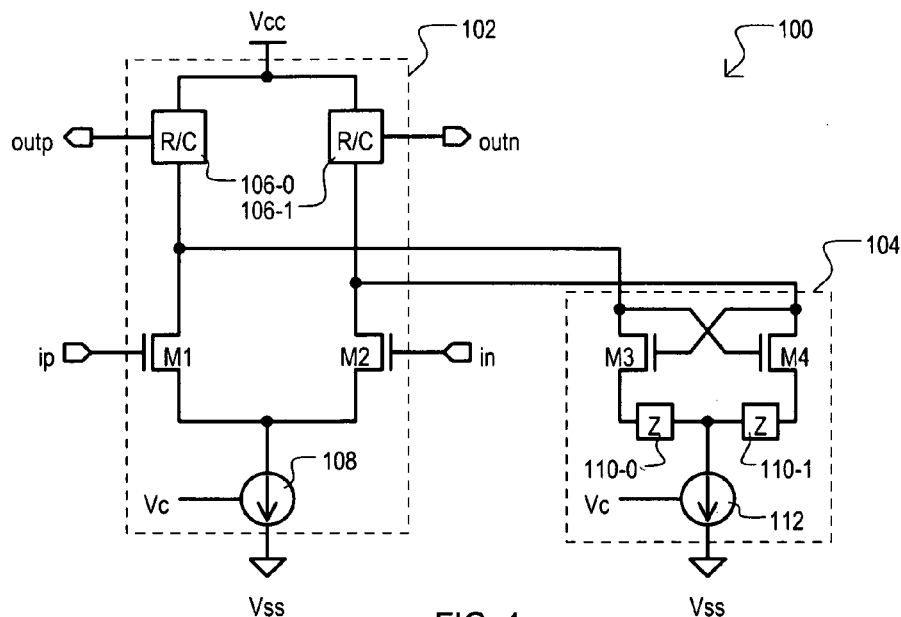
FIG. 1 is a circuit schematic diagram of a delay cell circuit according to an embodiment.

Referring to FIG. 1, a delay cell circuit according to an embodiment is set forth in a circuit schematic diagram and given the reference character 100. Delay cell circuit 100 may be used in a voltage controlled oscillator (VCO), as just one example. Delay cell circuit 100 may receive a differential input voltage at differential input terminals (ip and in) and may provide a differential output voltage at differential output terminals (outp and outn).

A delay cell circuit 100 may include a differential stage 102 and a cross-coupled stage 104.

Differential stage 102 may include transistors (M1 and M2), resistor/capacitor (R/C) circuits (106-0 and 106-1), and a variable current source 108. Transistors (M1 and M2) may have a common source configuration to form a differential pair. Transistor M1 may have a gate connected to differential input terminal ip, a drain connected to R/C circuit 106-0, and a source connected to the source of transistor M2. Transistor M2 may have a gate connected to differential input in and a drain connected to R/C circuit 106-1. R/C circuit 106-0 may be connected between a power supply Vcc and a drain of transistor M1 and may provide differential output terminal outp. R/C circuit 106-1 may be connected between a power supply Vcc and a drain of transistor M2 and may provide differential output terminal outn. Variable current source 108 may be connected between commonly coupled sources of transistors (M1 and M2) and a ground potential VSS. Variable current source 108 may provide a current that is dependent upon a control voltage Vc. Transistors (M1 and M2) may be n-channel insulated gate field effect transistors (IGFETs), such as MOS transistors.

Cross-coupled stage 104 may include transistors (M3 and M4), impedance elements (110-0 and 110-1), and variable current source 112. Transistors (M3 and M4) can be in a cross-coupled configuration such that transistor M3 has a drain connected to the gate of transistor M4 and transistor M4 has a drain connected to the gate of transistor M3. Transistor M3 has a drain connected to the drain of transistor M1 and a source connected to a first terminal of impedance element 110-0. Transistor M4 has a drain connected to the drain of transistor M2 and a source connected to a first terminal of impedance element 110-1. Impedance elements (110-0 and 110-1) may each have a second terminal connected to a first terminal of variable current source 112. Variable current source 112 can have a second terminal connected to ground Vss. Variable current source 112 can provide a current that is dependent upon a control voltage Vc. Transistors (M3 and M4) may be n-channel IGFETs, such as MOS transistors.

Thus, unlike conventional delay circuit 600, delay circuit 100 can include impedance elements (110-0 and 110-1) disposed between the source of transistors (M3 and M4) respectively and a first terminal of variable current source 112.

As mentioned earlier, delay cell 100 may be incorporated in a ring oscillator comprising a voltage controlled oscillator. A delay for the delay cell 100 (and hence the oscillation frequency in a ring oscillator configuration) may be established by varying the rate at which current is sourced from both the differential stage 102 and cross-coupled stage 104. More particularly, a total current drawn by both transistors (M1 and M2) of differential pair may decrease as frequency increases. This may be accomplished by lowering the magnitude of control voltage Vc. Similarly, a total current drawn by both transistors (M3 and M4) of cross-coupled pair (M3 and M4) may increase as frequency decreases. A control voltage Vc can have a magnitude derived from a phase difference between a received clock and feedback block of a phase lock loop (PLL) circuit.

Figure 6:
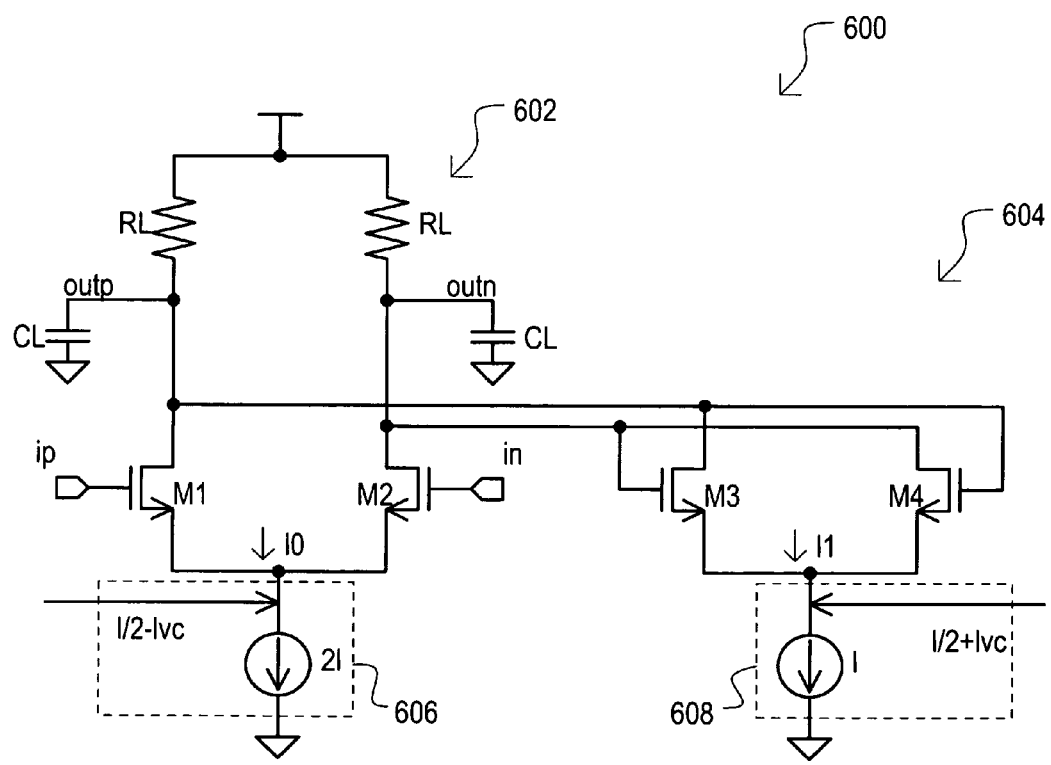
FIG. 6 is a circuit schematic diagram of a conventional delay cell circuit.

In such an arrangement, impedance elements (110-0 and 110-1) can reduce a gain of cross-coupled stage 104. More particularly, a gain of cross-coupled stage 104 can be less than that of differential stage 102, even when a current drawn by cross-coupled stage 104 is greater than that of differential stage 102. Thus, a ring oscillator employing delay cell circuit 100 may be capable of a wider frequency tuning range than a ring oscillator including conventional delay cell circuit 600 illustrated in FIG. 6.

Figure 2:
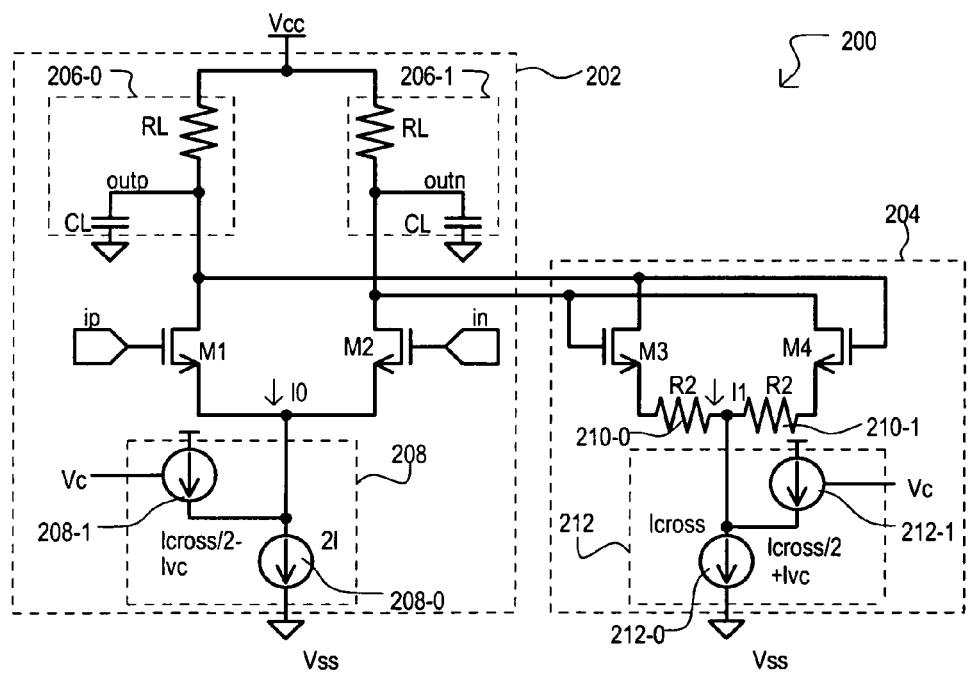
FIG. 2 is a circuit schematic diagram of a delay cell circuit according to an embodiment.

Referring now to FIG. 2, a delay cell circuit according to another embodiment is set forth in a circuit schematic diagram and given the general reference character 200. Delay cell circuit 200 may include similar constituents as delay cell circuit 100, and like constituents will be referred to by the same reference character, except the first digit is a "2" instead of a "1". Delay cell circuit 200 may be included as a delay cell circuit in a voltage controlled oscillator, as just one example. Delay cell circuit 200 may receive a differential input voltage at differential input terminals (ip and in) and may provide a differential output voltage at differential output terminals (outp and outn).

Delay cell circuit 200 may include a differential stage 202 and cross-coupled stage 204.

Differential stage 202 may differ from differential stage 102 in that more detailed R/C circuits (206-0 and 206-1) may be included and a variable current source 208 may be included. Each R/C circuit (206-0 and 206-1) may include a resistor RL and a capacitor CL. R/C circuit 206-0 may include a resistor RL having a first terminal connected to a power supply Vcc and a second terminal commonly connected to differential output terminal outp, a first terminal of a capacitor CL and commonly connected drains of transistors (M1 and M3). R/C circuit 206-1 may include a resistor RL having a first terminal connected to a power supply Vcc and a second terminal commonly connected to differential output terminal outn, a first terminal of a capacitor CL and commonly connected drains of transistors (M2 and M4). Each capacitor CL can include a second terminal connected to a ground Vss.

Variable current source 208 may include a constant current source component 208-0 and a variable current component 208-1. Constant current source component 208-0 may be connected between commonly connected sources of transistors (M1 and M2) and ground Vss. Variable current source component 208-1 may be connected between a power supply voltage Vcc and commonly connected sources of transistors (M1 and M2) and may receive a control voltage Vc. Constant current source component 208-0 may provide a current (2I). Variable current source component 208-1 may provide a current (Icross/2−Ivc). In the particular example shown, current Ivc can be proportional to a control voltage Vc in the range from about −Icross/2 to +Icross/2.

Cross-coupled stage 204 may differ from cross-coupled stage 104 in that cross-coupled stage may include resistors (210-0 and 210-1) and variable current source 212. Resistors (210-0 and 210-1) may each have an essentially matching resistance value of R2. Resistors (210-0 and 210-1) may be connected between a source of transistors (M3 and M4), respectively, and the variable current source 212. Thus, cross-coupled stage 204 differs from the cross-coupled stage 604 of conventional delay cell circuit 600 in that the sources of cross-coupled transistors (M3 and M4) are not commonly connected, but instead have intervening resistors (210-0 and 210-1).

Variable current source 212 may include a constant current source component 212-0 and a variable current component 212-1. Constant current source component 212-0 may be connected between commonly connected terminals of resistors (210-0 and 210-1) and ground Vss. Variable current source component 212-1 may be connected between a power supply voltage Vcc and commonly connected sources of resistors (210-0 and 210-1) and may receive a control voltage Vc. Constant current source component 212-0 may provide a current (Icross). Variable current source component 212-1 may provide a current (Icross/2+Ivc). In the particular example shown, current Ivc can be proportional to a control voltage Vc. Furthermore, a current Icross may be greater than a current I.

In such an arrangement, at a maximum frequency the following conditions generally occur:

$Ivc=Icross/2, I0=2I,$ and $I1=0.$

However, at a minimum frequency, the following conditions generally occur:

$Ivc=-Icross/2, I0=2I-Icross, I1=Icross$ (with $Icross>I$).

As but one very particular example, if Icross=1.2I, then I0=0.8I, and I1=1.2I. Accordingly, even at such a lower frequency, where I1>I0, a ring oscillator may continue to oscillate. This is in contrast to a conventional ring oscillator including conventional delay cell circuit 600, in which oscillations may cease once I1=I0.

In this way, a ring oscillator type VCO including stages comprising delay cell circuit 200 may provide a greater frequency tuning range than conventional approaches.

As noted above, delay cell circuits (100 and 200) can be included in a ring type oscillator circuit. One such example is illustrated in FIG. 3. Referring now to FIG. 3, a ring oscillator is set forth in a block schematic diagram and given the general reference character 300.

Ring oscillator 300 can include a number of delay cell circuits (302-0 to 302-n), arranged in a ring, where n is typically an odd number. Each delay cell circuit can receive a control voltage Vc. One or both output signals (outp and outn) can be tapped and conditioned by a conditioner circuit 304 to provide a voltage controlled oscillating signal VCO_OUT.

As noted above, delay cell circuits (100 and 200) may improve a tuning frequency range of a VCO as compared to a conventional delay cell circuit 600. Referring now to FIG. 4, a table sets forth simulation results showing a comparison between a VCO utilizing conventional delay cell circuit 600 and delay cell circuit 200. The simulation results are for delay cells having essentially identical circuit elements, except delay cell circuit 200 includes resistors R2 in cross-coupled stage 204. The simulation was for a ring oscillator of 4 delay cell circuits having circuit elements with the following values.

$M1/M2/M3/M4=W/L=6.8 \mu m/0.2 \mu m$ $CL=100 \text{ fF}$ $RL=1000\Omega$

FIG. 4 shows one column for a ring oscillator using a conventional delay circuit 600 (Old circuit), and two columns for a ring oscillator using delay cell circuit 200 according to an embodiment, one for a resistor R2 value 75Ω and one for a resistor R2 value of 150Ω. Each such column shows a resulting ring oscillator frequency for a given control voltage value Vc. It is understood that in the arrangement shown, as control voltage decreases, control current Ivc increases.

As shown, a ring oscillator using conventional delay cell circuit 600 fails to oscillate at control voltages of 115 mV and greater thus providing a lower limit frequency of about 409.5 MHz. In contrast, a ring oscillator using delay cell circuit 200 according to an embodiment of the present invention, considerably larger control voltage can provide for greater frequency ranges. In particular, when a resistor (210-0 and 210-1) has a resistance value R2=75Ω, a control voltage may be at least as high as 135 mV to provide a lower operating frequency of at least 333.6 MHz and when a resistor (210-0 and 210-1) has a resistance value R2=150Ω, a control voltage may be at least as high as 135 mV to provide a lower operating frequency of at least 306 MHz.

Thus, it is shown, that by providing an impedance device, such as resistors (210-0 and 210-1) in cross-coupled circuit (104 and 204), a gain of the cross-coupled circuit may be attenuated and a tuning frequency range of a VCO using delay cell circuits (100 and 200) may be improved. In this way, resistors (210-0 and 210-1) may be conceptualized as gain attenuating resistors, gain attenuating devices and/or a gain attenuating circuit.

Referring now to FIG. 5, a content addressable memory (CAM) device according to one embodiment is set forth and given the general reference character 500. CAM device 500 can include a phase locked loop (PLL) circuit 502 that receives an external clock CLK_EX and provides a "locked" internal clock CLK_INT. Such a PLL circuit 502 can include a ring oscillator 502-0 having delay cell circuits 502-1 like delay cell circuits (100 and 200) illustrated in FIGS. 1 and 2 above. An internal clock CLK_INT can be provided to a clock circuit 504 which can provide clock timing signals to one or more CAM arrays (506-0 to 506-n). Clock timing signals may be provided to control circuits (not shown) providing control signals to each CAM array (506-0 to 506-n), as just one example.

A resulting CAM device 500 can provide timing signals having an advantageously wider operating range, without having to adjust or include frequency divider circuits, or the like.

Of course, while the above embodiments have shown a delay cell circuit (100 and 200) that may be included in a ring oscillator, more particularly within a ring type VCO, and even more particularly within a VCO of a PLL, the present invention should not be limited to such particular applications.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A delay cell circuit, comprising:
a differential stage coupled to receive a differential input voltage at first and second differential input terminals and provide a differential output voltage at first and second differential output terminals, the differential stage including a first variable current source that provides a differential stage current that decreases in response to a first control input; and
a cross-coupled stage coupled to the differential output terminals and including a first gain attenuating resistor and a second variable current source, coupled to commonly coupled second terminals of the first and a second gain attenuating resistor, that provides a cross-coupled stage current that increases in response to the control input.

2. The delay cell circuit of claim 1, wherein the cross-coupled stage includes the second gain attenuating resistor.

3. The delay cell circuit of claim 2, wherein:
the cross-coupled stage includes
a first transistor having a gate coupled to the first differential output terminal, a drain coupled to the second differential output terminal, and a source coupled to a first terminal of the first gain attenuating resistor; and
a second transistor having a gate coupled to the second differential output terminal, a drain coupled to the first differential output terminal, and a source coupled to a first terminal of the second gain attenuating resistor.

4. The delay cell circuit of claim 1, wherein:
the differential stage includes
a first differential transistor having a gate coupled to the first differential input terminal, a drain coupled to the first differential output terminal, and a source;
a second differential transistor having a gate coupled to the second differential input terminal, a drain coupled to the second differential output terminal, and a source commonly coupled to the source of the first differential transistor; and
the second variable current source is coupled to the commonly coupled sources of the first and second differential transistors.

5. The delay cell circuit of claim 4, wherein:
the second variable current source includes a second constant current source component coupled between the commonly coupled sources of the first and second differential transistors and a first reference voltage and a second variable current source component coupled between the commonly coupled sources of the first and second differential transistors and a second reference voltage and the second variable current source component varies in accordance with the control input, which comprises a control voltage.

6. The delay cell circuit of claim 5, wherein:
the delay cell circuit comprises a portion of a voltage control oscillator and the second variable current source component decreases current as frequency of oscillation increases.

7. A delay cell circuit, comprising:
a differential stage coupled to receive a differential input voltage at first and second differential input terminals and provide a differential output voltage at first and second differential output terminals, and including a first voltage controlled variable current source that varies a differential stage current in a first way in response to a control voltage; and
a cross-coupled stage coupled to the differential output terminals and including a first gain attenuating resistor, and a second voltage controlled variable current source coupled to commonly coupled second terminals of the first and a second gain attenuating resistor that varies a cross-coupled stage current in a second way, different from the first way, in response to the control voltage.

8. The delay cell circuit of claim 7, wherein:
the delay cell circuit comprises a portion of a voltage controlled oscillator and the first voltage controlled variable current source provides a current to the first gain attenuating resistor that decreases as the frequency increases.

9. The delay cell circuit of claim 7, wherein:
the delay cell circuit comprises a portion of a voltage controlled oscillator and the voltage controlled variable current source provides a current to the differential stage that increases as the frequency increases.

10. A delay cell circuit, comprising:
a differential stage coupled to receive a differential input voltage at first and second differential input terminals and provide a differential output voltage at first and second differential output terminals, and including a voltage controlled variable current source providing current for the differential stage; and
a cross-coupled stage coupled to the differential output terminals comprising a gain attenuating circuit and a first cross-coupled stage including a first transistor with a drain directly connected to the first differential output terminal and a gate directly connected to the second differential output terminal, and a second transistor with a drain directly connected to the second differential output terminal and a gate directly connected to the first differential output terminal.

11. The delay cell circuit of claim 10, wherein:
the cross-coupled stage includes
a first voltage controlled variable current source providing current for the cross-coupled stage.

12. The delay cell circuit of claim 11, wherein:
the delay cell circuit comprises a portion of a voltage controlled oscillator and the first voltage controlled variable current source provides a current to the cross-coupled stage that decreases as the frequency increases.

13. The delay cell circuit of claim 10, wherein:
the delay cell circuit comprises a portion of a voltage controlled oscillator and the voltage controlled variable current source provides a current to the differential stage that increases as the frequency increases.

14. The delay cell circuit of claim 10 further including:
the first and second differential output terminals are each coupled to a resistor/capacitor circuit; and
the gain attenuating circuit includes a pair of essentially matching resistors having a resistance value in the range of about 75-150 ohms coupled between common sources of a first and second cross-coupled transistors, the first cross-coupled transistor having a drain coupled to the first differential output node and the second cross-coupled transistor having a drain coupled to the second differential output node.

* * * * *